(12) United States Patent
Tsuji et al.

(10) Patent No.: US 6,411,563 B1
(45) Date of Patent: Jun. 25, 2002

(54) SEMICONDUCTOR INTEGRATED CIRCUIT DEVICE PROVIDED WITH A LOGIC CIRCUIT AND A MEMORY CIRCUIT AND BEING CAPABLE OF EFFICIENT INTERFACE BETWEEN THE SAME

(75) Inventors: Takaharu Tsuji, Hyogo; Toshiaki Kawasaki, Osaka, both of (JP)

(73) Assignees: Mitsubishi Denki Kabushiki Kaisha, Tokyo; Matsushita Electric Industrial Col, Ltd., Osaka, both of (JP)

( * ) Notice: Subject to any disclaimer, the term of this patent is extended or adjusted under 35 U.S.C. 154(b) by 56 days.

(21) Appl. No.: 09/814,108

(22) Filed: Mar. 22, 2001

(30) Foreign Application Priority Data

Aug. 28, 2000 (JP) ........................................ 2000-256863

(51) Int. Cl.$^7$ ................................................ G11C 8/00
(52) U.S. Cl. .................. 365/233; 365/201; 365/189.05; 365/230.06
(58) Field of Search ................................ 365/233, 201, 365/189.05, 189.09, 230.06, 230.08

(56) References Cited

U.S. PATENT DOCUMENTS 6,295,238 B1 * 9/2001 Tanizaki et al. ............. 365/233

FOREIGN PATENT DOCUMENTS

JP    10-283777    10/1998

* cited by examiner

*Primary Examiner*—David Nelms
*Assistant Examiner*—David Lam
(74) *Attorney, Agent, or Firm*—McDermott, Will & Emery

(57) ABSTRACT

In accordance with externally applied data and a control signal, a logic circuit performs an arithmetic operation on the data to produce a control signal corresponding to either an SDRAM operation mode or an EDO-DRAM operation mode. A controller receives the control signal from the logic circuit, and produces a general-purpose SDRAM control signal for applying it to a DRAM core. The DRAM core includes a plurality of decoder circuits provided corresponding to the operation modes for decoding the corresponding control signals to produce internal control signals for a memory cell array, respectively.

10 Claims, 21 Drawing Sheets

| STANDARD SDRAM COMMAND INPUT | | | | INTERNAL CONTROL COMMAND | | | | |
|---|---|---|---|---|---|---|---|---|
| /CS | /RAS | /CAS | /WE | ACT | PRC | WRITE | READ | REF |
| L | L | H | H | H | L | L | L | L |
| L | H | H | L | L | H | L | L | L |
| L | H | L | L | L | L | H | L | L |
| L | H | L | H | L | L | L | H | L |
| L | L | L | L | L | L | L | L | H |

FIG.6

| CLOCK SYNCHRONOUS EDO COMMAND INPUT | | | | | INTERNAL CONTROL COMMAND | | | | |
|---|---|---|---|---|---|---|---|---|---|
| /CS | /RAS | /CAS | /WE | /RAUT | ACT | PRC | WRITE | READ | REF |
| L | L | H | X | H | H | L | L | L | L |
| L | H | H | X | H | L | H | L | L | L |
| L | L | L | L | L | L | L | H | L | L |
| L | L | L | H | H | L | L | L | H | L |
| L | H | H | H | L | L | L | L | L | H |

X : H or L don't care

FIG.18

| DECODE TABLE | | | | DQSEL | | | | | | | | | | | | | | | | |
|---|---|---|---|---|---|---|---|---|---|---|---|---|---|---|---|---|---|---|---|---|
| DQAD ⟨3⟩ | ⟨2⟩ | ⟨1⟩ | ⟨0⟩ | ⟨0⟩ | ⟨1⟩ | ⟨2⟩ | ⋮ | ⟨13⟩ | ⟨14⟩ | ⟨15⟩ |
| 0 | 0 | 0 | 0 | H | L | L | | L | L | L |
| 0 | 0 | 0 | 1 | L | H | L | | L | L | L |
| 0 | 0 | 1 | 0 | L | L | H | | L | L | L |
| 0 | 0 | 1 | 1 | L | L | L | | L | L | L |
| 0 | 1 | 0 | 0 | L | L | L | | L | L | L |
| 0 | 1 | 0 | 1 | L | L | L | | L | L | L |
| 0 | 1 | 1 | 0 | L | L | L | | L | L | L |
| 1 | 0 | 0 | 0 | L | L | L | | L | L | L |
| ⋮ | ⋮ | ⋮ | ⋮ | | | | ⋯ | | | |
| 1 | 1 | 1 | 0 | L | L | L | | L | H | L |
| 1 | 1 | 1 | 1 | L | L | L | | L | L | H |

| COMMAND SWITCH | TEST SWITCH | DECODED SIGNAL A B C D |
|---|---|---|
| L | L | L L H L |
| L | H | H L L H |
| H | L | L H L L |
| H | H | H L L H |

SEMICONDUCTOR INTEGRATED CIRCUIT DEVICE PROVIDED WITH A LOGIC CIRCUIT AND A MEMORY CIRCUIT AND BEING CAPABLE OF EFFICIENT INTERFACE BETWEEN THE SAME

BACKGROUND OF THE INVENTION

1. Field of the Invention

The present invention relates to a structure of a semiconductor integrated circuit device including a memory core and a logic circuit mounted on a single chip.

2. Description of the Background Art

In a recent technology of a semiconductor integrated circuit, circuit structures aimed at further technological innovation are being practically available for improving packing densities and operation speeds. More specifically, for reducing manufacturing costs of semiconductor integrated circuit devices and increasing operation speeds thereof, technical developments have been made to provide a semiconductor integrated circuit device, in which a semiconductor memory device and a semiconductor logic circuit device are mounted on a single chip in a mixed fashion.

FIG. 24 is a schematic block diagram of a conventional semiconductor integrated circuit device, which is provided with a semiconductor memory device and a semiconductor logic circuit device in a mixed fashion, and particularly shows a structure of a semiconductor integrated circuit device 8000 disclosed in Japanese Patent Laying-Open No. 10-283777.

Referring to FIG. 24, semiconductor integrated circuit device 8000 in the prior art includes a semiconductor memory device such as a synchronous dynamic random access memory core (which will be referred to as an "SDRAM core" hereinafter) 104, a logic circuit 102 and an SDRAM controller 103 which is a fast interface arranged between logic circuit 102 and SDRAM core 104 for fast operation of circuitry provided with logic circuit 102 and SDRAM core 104 in a mixed fashion.

More specifically, semiconductor integrated circuit device 8000 is provided with an external terminal group 101 which is employed for receiving external control signals, and includes a terminal group 110 for applying control signals and data to logic circuit 102, and an external clock input terminal 105 for externally applying a clock signal to a clock producing circuit 106.

SDRAM controller 103 operates in accordance with a clock signal CLK applied from clock producing circuit 106, and is controlled by logic circuit 102 to apply to SDRAM core 104 internal control signals such as an activating signal ACT(114), a precharge signal PRC(115), a write signal WRITE(116), a read signal READ(117) and a refresh signal REF(118).

An input synchronization latch circuit, i.e., a latch circuit 8122 for input latch latches a signal supplied to SDRAM core 104, and a timing producing circuit 8123 produces an internal operation signal to be applied to a memory array 8121 in accordance with the output of input synchronization latch circuit 8122. Input synchronization latch circuit 8122 operates in synchronization with clock signal CLK sent from clock producing circuit 106.

An output control circuit 8124 sends the output of memory array 8121 to SDRAM controller 103 in synchronization with internal dock signal CLK.

Thus, the signals supplied to external terminal group 101 are successively converted when they pass through logic circuit 102, SDRAM controller 103, input synchronization latch circuit 8122 and timing producing circuit 8123, and then are applied to memory array 8121.

The internal operation signals applied to memory array 8121 include a signal for designating the time of activation of a word line, a signal for instructing start and stop of precharging of a bit line pair, a signal for instructing start and stop of an operation of a sense amplifier, a memory cell column select signal for selectively performing reading of data from the bit line pair, a read amplifier activating signal for activating a read amplifier which reads out data from the bit line pair, and a write driver activating signal for driving a write drive transmitting write data onto the bit line pair.

The internal control signals applied from SDRAM controller 103 to SDRAM core 104 are already converted into the internal control signals for operating timing producing circuit 8123.

In the case where the SDRAM is an SDRAM memory of one chip, this SDRAM memory receives the external control signals from the external terminals, and operates in accordance with the received external control signals. However, a general-purpose single SDRAM can use only a restricted number of external terminals, and therefore is generally and internally provided with a decoder for decoding such external control signals.

If such a command decoder for decoding commands, which are provided by externally supplied control signals, is employed in SDRAM core 104 shown in FIG. 24, a delay time of this command decoder delays the operation of SDRAM core 104.

The structure shown in FIG. 24 is not provided with such a command decoder, and thereby can operate faster.

FIG. 25 is a timing chart for showing an operation of semiconductor integrated circuit device 8000 shown in FIG. 24.

For example, internal control signal ACT(114) is produced within SDRAM controller 103 in synchronization with rising edge timing of internal clock signal CLK at a time t0. Therefore, it is issued from SDRAM controller 103 with a delay of a time t(control) from the rising edge of internal clock signal CLK at time t0.

Assuming that input synchronization latch circuit 8122 has a setup time t(setup), the following formula must be satisfied so that input synchronization latch circuit 8122 can take in signal ACT(114) at a time t1 after one cycle t(CLK) from time t0 of rising edge of signal ACT(107).

$$t(CLK) > t(control) + t(setup)$$

Similar relationship must be satisfied in connection with other internal control signals such as signals PRC(115), WRITE(116) and READ(117).

Since the minimum cyclic period of internal clock signal CLK does not require a time for decoding in SDRAM core 104 as described above, this can improve the operation speed.

The structure of semiconductor integrated circuit device 8000 described above can improve the operation speed, but suffers from the following problem.

In a process of designing semiconductor integrated circuit device 8000, it is generally desired that a portion forming SDRAM core 104 employs the same circuit structure as that for the device including logic circuit 102 of a different structure.

On the other hand, it is desired that logic circuit 102 employs the same circuit structure as that, which has already been designed and proven.

If the design of logic circuit 102 is based on the presumption that it issues control signals for a general purpose SDRAM chip, SDRAM core 104 is configured to receive internal control signals, which are prepared by decoding general-purpose SDRAM control signals, from an interface. Accordingly, SDRAM controller 103 must have a function of converting the SDRAM control signal sent from logic circuit 102 to the internal control signals.

The design data which has been conventionally accumulated for logic circuit 102 includes not only data for a system, where external control signals for a specific general-purpose SDRAM are sent to the interface, but also data for an external command system, in which external control signals, e.g., for a clock synchronous EDO-DRAM (Extended Data Out-DRAM) are sent to an interface.

Accordingly, the interface for the logic circuit, of which design data has been accumulated, must be redesigned whenever the interface specifications of the memory for data transmission are changed, and in other words, whenever the external command system is changed. This means that SDRAM controller 103 must be redesigned in accordance with the interface specifications of logic circuit 102 and corresponding SDRAM core 104 every time the above change occurs, and therefore lowers design efficiencies.

SUMMARY OF THE INVENTION

An object of the invention is to provide a semiconductor integrated circuit device, in which a logic circuit and a memory circuit are arranged in a mixed fashion, and are efficiently interfaced with each other while utilizing design rules already accumulated for the logic circuit.

Another object of the invention is to provide a semiconductor integrated circuit device, which can be easily designed utilizing a semiconductor memory device library adaptable to various interfaces such as already-existing general-purpose SDRAMs and clock synchronous EDO-DRAMs.

A still another object of the invention is to provide a semiconductor integrated circuit device, which includes a semiconductor memory and a semiconductor logic circuit arranged in a mixed fashion, and allows direct test of the semiconductor memory.

In summary, the invention provides a semiconductor integrated circuit device including a logic circuit, a control circuit, a memory circuit and a plurality of interconnections.

A logic circuit performs an arithmetic operation on externally applied data in accordance with the data and an externally applied control signal, and produces a control signal corresponding to one of a plurality of operation modes.

The control circuit receives the control signal from the logic circuit, and produces a memory control signal group having a plurality of memory control signals.

The memory circuit transmits storage data to and from the logic circuit, and stores the storage data. The memory circuit includes a memory cell array, a plurality of control signal input node group and a plurality of decoder circuits. The memory cell array has a plurality of memory cells for storing the storage data. The plurality of control signal input node groups can receive the plurality of memory control signal groups corresponding to the plurality of operation modes, respectively. The plurality of decoder circuits are provided for the plurality of control signal input node groups for decoding the memory control signal groups applied to the corresponding control signal input node groups, respectively, and producing an internal control signal for the memory cell array.

The plurality of interconnections transmits the memory control signal group sent from the control circuit to one of the plurality of control signal input node groups.

Preferably, the memory circuit includes a plurality of test signal input terminal groups, a plurality of switch circuits, a select circuit, a plurality of test data I/O terminals and an I/O control circuit.

The plurality of test signal input terminal groups are provided for the plurality of decoder circuits for receiving a test control signal, respectively. The plurality of switch circuits are arranged between the plurality of control signal input node groups and the plurality of decoder circuits, receive signals sent from the plurality of control signal input node groups and signals sent from the plurality of test signal input terminal groups, and apply the signals sent from either the control signal input node groups or the test signal input terminal groups to the plurality of decoder circuits in response to an externally applied instruction, respectively. The select circuit selects the internal control signal sent from the designated decoder circuit among the plurality of decoder circuits in accordance with an externally applied instruction. The plurality of test data I/O terminals externally send and receive data. The I/O control circuit controls data transmission between the memory cell array and the plurality of test data I/O terminals in a test operation mode.

Preferably, the memory circuit further includes a test signal input terminal group, a select circuit, a plurality of test data I/O terminals and an I/O control circuit.

The test signal I/O terminal group receives a test control signal. The select circuit selects either the internal control signals sent from the plurality of decoder circuits or the signals sent from the test signal input terminal group in accordance with an externally applied instruction. The plurality of test data I/O terminals externally send and receive data. The I/O control circuit controls data transmission between the memory cell array and the plurality of test data I/O terminal in the test operation mode.

Accordingly, it is possible to operate the memory circuit in any one of the plurality of operation modes without requirement for any change in design data for the memory circuit portion, which is an advantage of the invention. In connection with this, structures of the control circuits corresponding to the respective operation modes can be designed in advance in accordance with the respective operation modes. By registering in advance the logic circuit portions and the control circuits as design libraries, it is possible to change the structure between that for a certain operation mode and that for another operation mode without difficulty.

Another advantage of this invention is that only the operation of the memory circuit can be verified independently of the logic circuit and the control circuit.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 6 shows contents of general-purpose commands of a clock synchronous EDO-DRAM and corresponding internal control signals;

FIG. 18 shows a decode operation of a decoder circuit 2210 shown in FIG. 17;

DESCRIPTION OF THE PREFERRED EMBODIMENTS

[First Embodiment]

Figure 1:
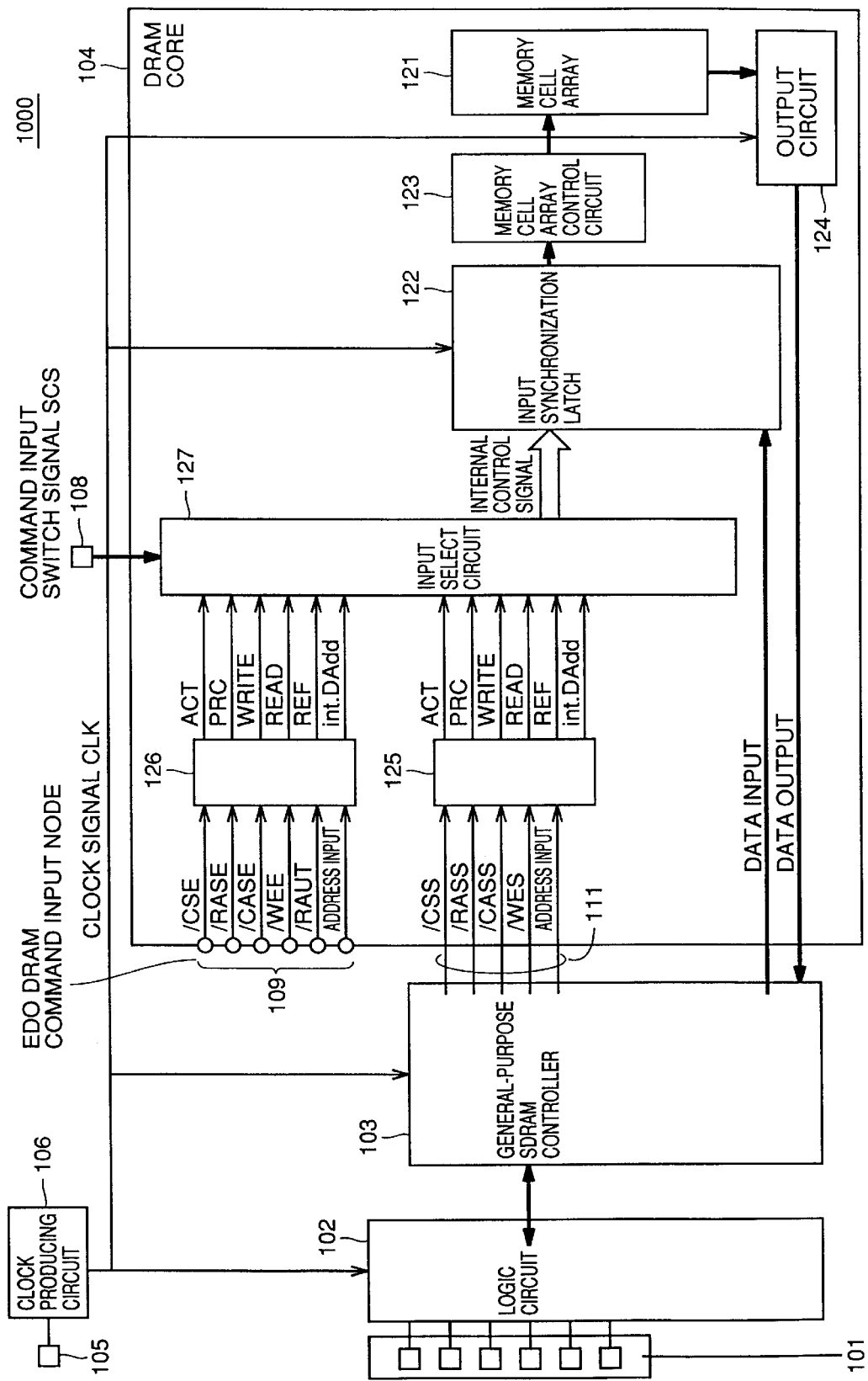
FIG. 1 is a schematic block diagram showing a structure of a semiconductor integrated circuit device 1000 of a first embodiment of the invention.

FIG. 1 is a schematic block diagram showing a structure of a semiconductor integrated circuit device 1000 of a first embodiment of the invention.

Referring to FIG. 1, semiconductor integrated circuit device 1000 includes an external terminal group 101 for externally receiving control signals and externally transmitting (i.e., sending and receiving) data, an external clock input terminal 105 for receiving an external clock signal, a clock producing circuit 106 for receiving the external clock signal through external input terminal 105, and producing an internal clock signal CLK, a logic circuit 102 for operating in accordance with internal clock signal CLK sent from clock producing circuit 106, and performing arithmetic operations on the control signals sent from external terminal group 101 and input data, a general-purpose SDRAM controller 103 which operates in accordance with internal clock signal CLK, and issues a general-purpose SDRAM control signal in accordance with the signal sent from logic circuit 102, a switch signal input terminal 108 which receives a command input switch signal SCS for externally switching a mode of an operation command for semiconductor integrated circuit device 1000, and a DRAM core 104 which is controlled by a signal applied from general-purpose SDRAM controller 103 via an interconnection 111, and thereby operates to store the data sent from logic circuit 102 in a designated address region or send the data stored in the designated address region to general-purpose SDRAM controller 103.

DRAM core 104 includes a first command decoder circuit 125 which receives general-purpose control signals /CS_S, /RAS_S, /CAS_S and /WE_S as well as an address signal input from general-purpose SDRAM controller 103, and converts then to internal control signals ACT, PRC, WRITE, READ and REF as well as an internal decoded address signal int.DAcc, a second command decoder circuit 126 which issues internal control signals prepared by converting general-purpose EDO-DRAM control signals /CS_E, /RAS_E, /CAS_E, /WE_E and /RAUT when it receives these EDO-DRAM control signals and the address signal input from EDO DRAM command input nodes 109, an input select circuit 127 which receives the outputs of first and second command decoder circuits 125 and 126, and selectively sends therefrom the received outputs in accordance with command input switch signal SCS sent from switch signal input terminal 108, an input synchronization latch circuit 122 (i.e., latch circuit for input synchronization) which latches the internal control signal sent from input select circuit 127 in synchronization with internal clock signal CLK, a memory cell array control circuit 123 which receives the internal control signal sent from input synchronization latch circuit 122, and produces an internal operation signal for memory cell array 121, memory cell array 121 which is provided with memory cells MC arranged in a matrix form for storing data, and an output circuit 124 which sends the output of memory cell array 121 to general-purpose SDRAM controller 103 in synchronization with internal clock signal CLK.

Each of memory cells MC which are contained in memory cell array 121 is formed of a memory cell transistor MT and a memory cell capacitor MC.

General-purpose SDRAM controller 103 also applies data DataIN to be written into memory cell array 121 to input synchronization latch 122. This input data DataIN is applied from input synchronization latch circuit 122 to memory cell array 121 via memory cell array control circuit 123.

The signals sent to external terminal group 101 are converted through logic circuit 102, general-purpose SDRAM controller 103, general-purpose SDRAM command decoder circuit 125, input select circuit 127, input synchronization latch 122 and memory cell array control circuit 123, and then is supplied to memory array 121. In this operation, it is assumed that command input switch signal SCS is fixed at "H" level.

Figures 2, 3:
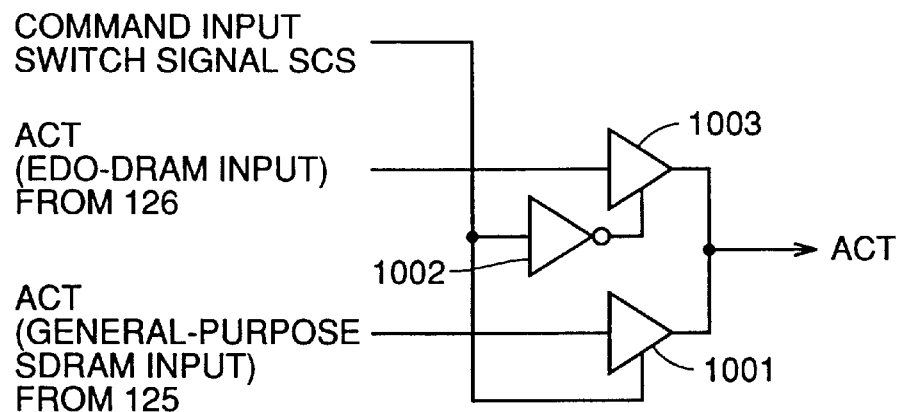
FIG. 2 is a circuit diagram showing a structure of a switch circuit 200.
FIG. 3 shows a correspondence between general-purpose SDRAM commands and internal control signals.

FIG. 2 is a circuit diagram showing a structure of a switch circuit 200, which is included in input select circuit 127 shown in FIG. 1, receives the internal control signal issued from first command decoder circuit 125 and corresponding internal control signal ACT issued from second command decoder circuit 126, and selectively issues one of the received signals in accordance with command input switch signal SCS.

For the other internal control signals, similar switch circuits are provided.

Switch circuit 200 includes a first drive circuit 1001 which receives signal ACT sent from first command decoder circuit 125, and is activated in accordance with the command switch signal, an inverter 1002 which receives and inverts command switch signal SCS for outputting it, and a drive circuit 1003 which receives signal ACT from second command decoder circuit 126, and is activated in accordance with the output signal of inverter 1002.

The signal sent from drive circuits 1001 or 1003 is applied as internal control signal ACT to input synchronization latch circuit 122 via input select circuit 127.

FIG. 3 shows a correspondence between the general-purpose SDRAM commands and the internal control signals. First command decoder circuit 125 shown in FIG. 1 converts the general-purpose SDRAM commands to the internal control signals as shown in FIG. 3.

For example, when chip select signal /CS is at "L" level, row address strobe signal /RAS is at "L" level, column address strobe signal /CAS is at "H" level and write enable signal /WE is at "H" level, only signal ACT among the internal control signals issued from first command decoder circuit 125 attains "H" level.

For other internal control signals PRC, WRITE, READ and REF, combinations of the active levels of the general-purpose SDRAM command signals are decoded to activate one of these internal control signals.

Figure 4:
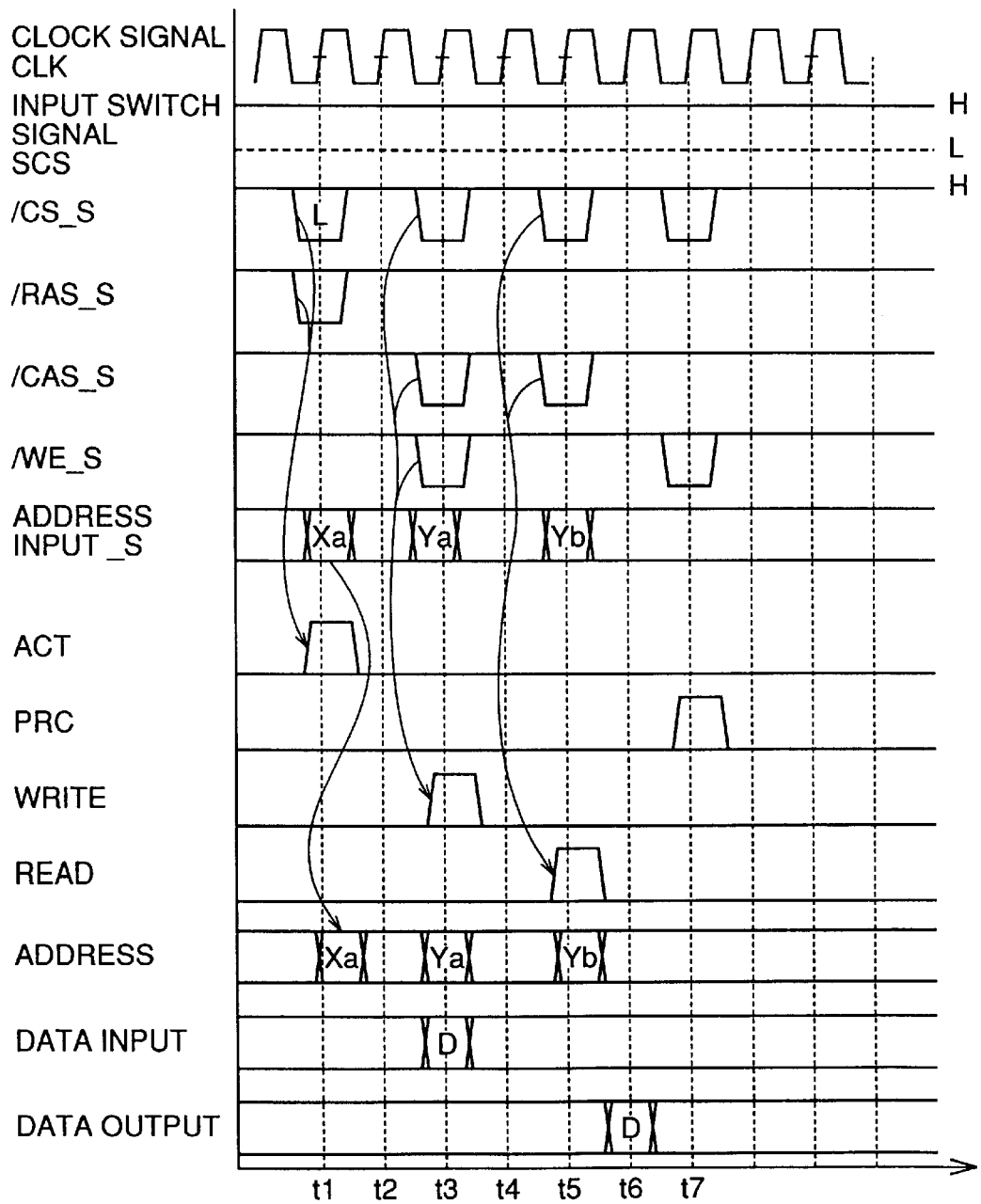
FIG. 4 is a timing chart for showing operations of semiconductor integrated circuit device 1000 shown in FIG. 1.

FIG. 4 is a timing chart for showing operations of semiconductor integrated circuit device 1000 shown in FIG. 1.

Referring to FIG. 4, at a time t1 of a rising edge of internal clock signal CLK, first command decoder circuit 125 drives the internal control signal ACT to the active state ("H" level) in response to the fact that both general-purpose SDRAM control signals /CS_S and /RAS_S sent to first command decoder circuit 125 from general-purpose SDRAM controller 103 are active and therefore at "L" level.

At time t1, general-purpose SDRAM controller 103 issues a row address signal Xa in response to the fact that signal /RAS_S is active.

In response to this, first command decoder circuit 125 issues the address signal to input select circuit 127.

Likewise, the write mode is designated in response to the fact that general-purpose SDRAM control signals /CS_S, /CAS_S and /WE_S are active at a time t3 of the rising edge of internal clock signal CLK. At the same time, general-purpose SDRAM controller 103 sends a column address signal Ya for data writing to first command decoder circuit 125.

In response to this, command decoder circuit 125 sets internal control signal WRITE to the active state ("H" level), and sends address signal Ya to input select circuit 127.

Further, general-purpose SDRAM controller 103 applies write data D to input synchronization latch circuit 122.

At a time t5 of the rising edge of internal clock signal CLK, the read mode is designated in response to the fact that general-purpose SDRAM control signals /CS_S and /CAS_S are active. At the same time, general-purpose SDRAM controller 103 sends a column address signal Yb for data reading to second command decoder circuit 125.

In response to this, command decoder circuit 125 sets internal control signal READ to the active state ("H" level), and sends address signal Yb to input select circuit 127.

Further, data D read from the memory cell, which is selected in accordance with address signal Yb, is sent from output circuit 124 to general-purpose SDRAM controller 103 at a time t6.

At a time t7 of the rising edge of internal clock signal CLK, general-purpose SDRAM controller 103 issues general-purpose SDRAM control signals /CS_S and /WE_S in the active state ("L" level).

In response to this, first command decoder circuit 125 drives internal control signal PRC to the active state ("H" level), and applies it to input select circuit 127. Internal control signal PRC is applied from input select circuit 127 to memory cell array control circuit 123 via input synchronization latch circuit 122, whereby a precharging operation is performed in memory cell array 121.

As described above, semiconductor integrated circuit device 1000 shown in FIG. 1 is configured such that input select circuit 127 selectively applies the signals sent from first command decoder circuit 125 to input synchronization latch circuit 122 in accordance with command input switch signal SCS applied from switch signal input terminal 108. Thereby, general-purpose SDRAM controller 103 applies general-purpose SDRAM control signals to DRAM core 104 so that the operations of DRAM core 104 can be controlled.

Figure 5:
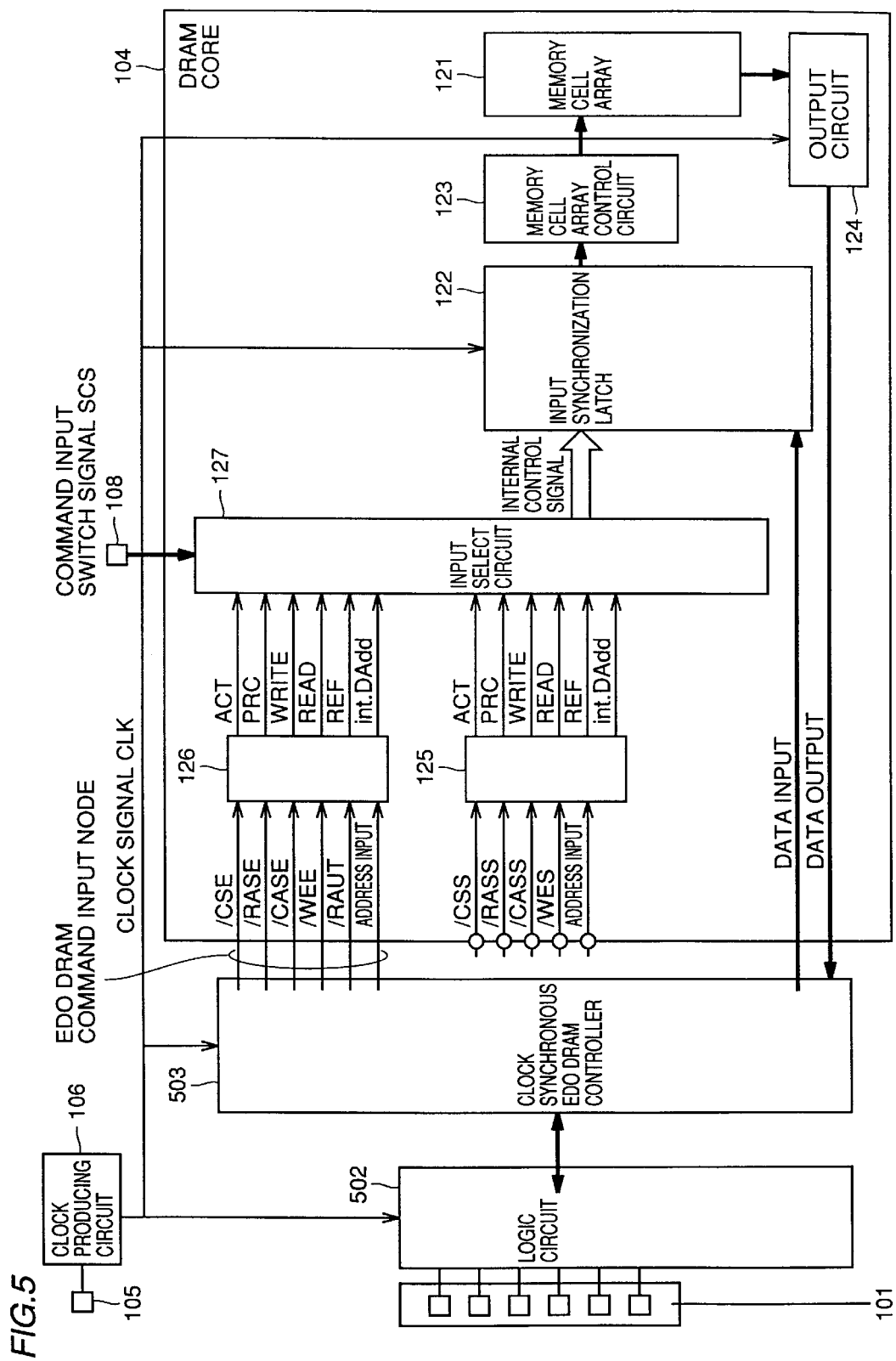
FIG. 5 is a schematic block diagram showing a structure of a semiconductor integrated circuit device 1000'.

FIG. 5 is a schematic block diagram showing a semiconductor integrated circuit device 1000', in which DRAM core 104 of the first embodiment of the invention is operated as a clock synchronous EDO-DRAM.

This structure differs from the structure of semiconductor integrated circuit device 1000 shown in FIG. 1 in that a logic circuit 502 is a circuit for producing and outputting control signals for the clock synchronous EDO-DRAM, and a clock synchronous EDO-DRAM controller 503 is provided instead of general-purpose SDRAM controller 103. The output of clock synchronous EDO-DRAM controller 503 is applied not to first command decoder circuit 125, but to second command decoder circuit 126.

Semiconductor integrated circuit device 1000' further has such a difference that command input switch signal SCS applied from switch signal input terminal 108 is at "L" level, and input select circuit 127 selectively applies the output of second command decoder circuit 126 to input synchronization latch circuit 122.

Structures other than the above are the substantially same as those of semiconductor integrated circuit device 1000 shown in FIG. 1. The corresponding portions bear the same reference numbers, and description thereof is not repeated.

FIG. 6 shows contents of the clock synchronous EDO-DRAM general-purpose commands, and a correspondence between those commands and the internal control signals issued from second command decoder circuit 126.

For example, when general-purpose EDO-DRAM control signals /CS_E and RAS_E are both at "L" level, and signals /CAS_E and RAUT of general-purpose EDO-DRAM commands are both at "H" level, second command decoder circuit 126 receiving these signals drives only signal ACT to "H" level. In FIG. 6, a character "X" represents that the internal control signal (command) is decoded without giving consideration to a value thereof.

In accordance with another combination of the general-purpose clock synchronous EDO-DRAM command signals, second command decoder circuit 126 activates one of internal control signals PRC, WRITE, READ and REF corresponding to the decode result.

Figure 7:
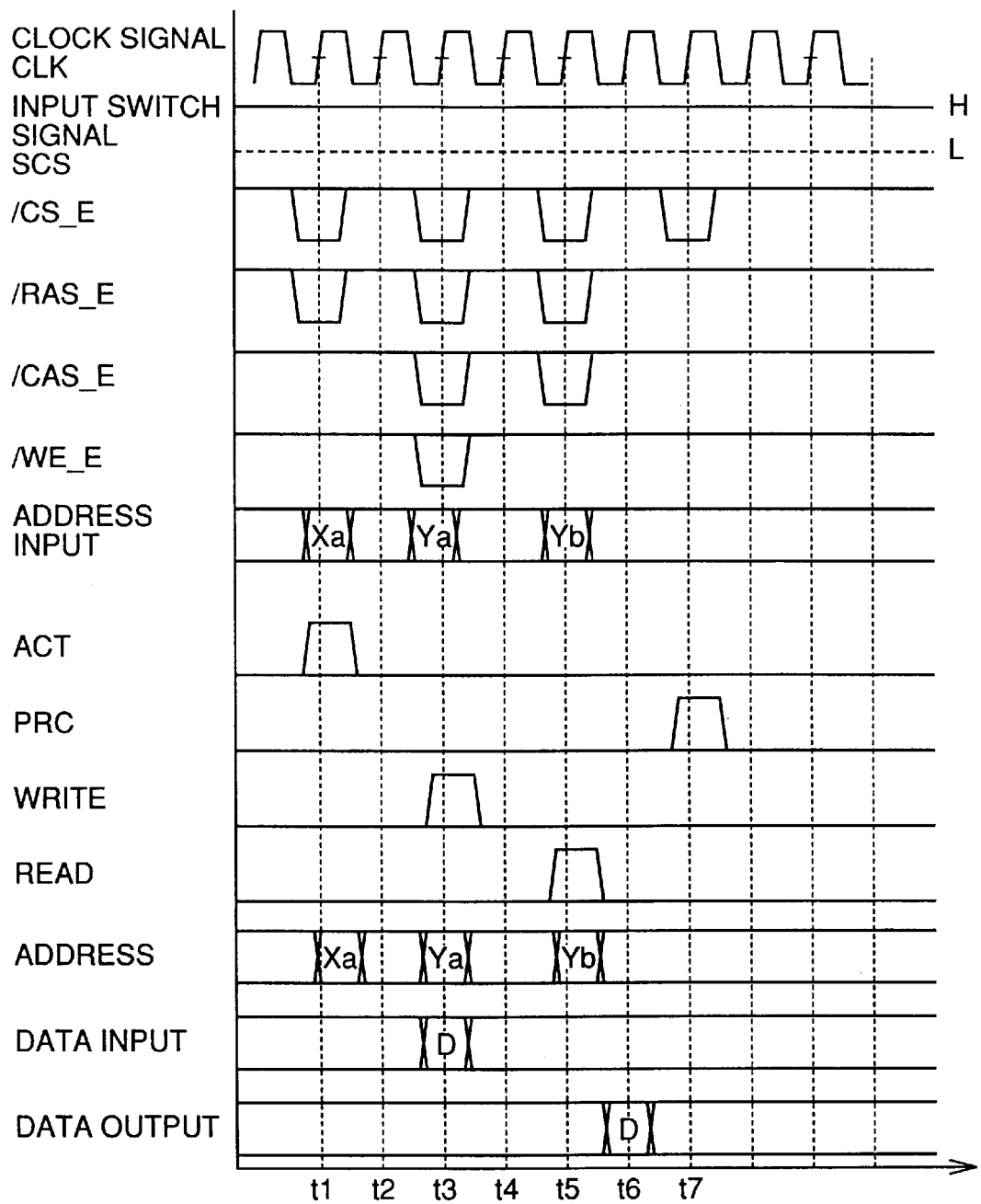
FIG. 7 is a timing chart for showing an operation of semiconductor integrated circuit 1000' shown in FIG. 5.

FIG. 7 is a timing chart similar to FIG. 4, but shows operations of semiconductor integrated circuit devices 1000' shown in FIG. 5.

The general-purpose SDRAM commands in FIG. 7 differ from those shown in FIG. 4 in that signal /RAS_E must be set to the active state ("L" level) when signal /CAS_E of general-purpose clock synchronous EDO-DRAM command is to be activated at times t3 and t5.

Structures and operations other than the above are the substantially same as those of DRAM core 104 shown in FIG. 4, and therefore description thereof is not repeated.
[Comparison in Structure Between DRAM Core 104 And One-Chip SDRAM]

As already described in FIGS. 1 and 5, the DRAM core has the structure including first command decoder circuit 125 for receiving the general-purpose SDRAM control commands for its operations, and second command decoder circuit 126 for receiving general-purpose clock synchronous EDO-DRAM commands for its operations.

For example, even in connection with the operation performed by receiving the general-purpose SDRAM control commands, the structure of DRAM core 104 differs from a general structure of a one-chip general-purpose SDRAM in transmission path of command signals for improving the operation speed. The difference will now be described. [Transmission Paths of Control Signals of One-Chip General-Purpose SDRAM]

Figure 8:
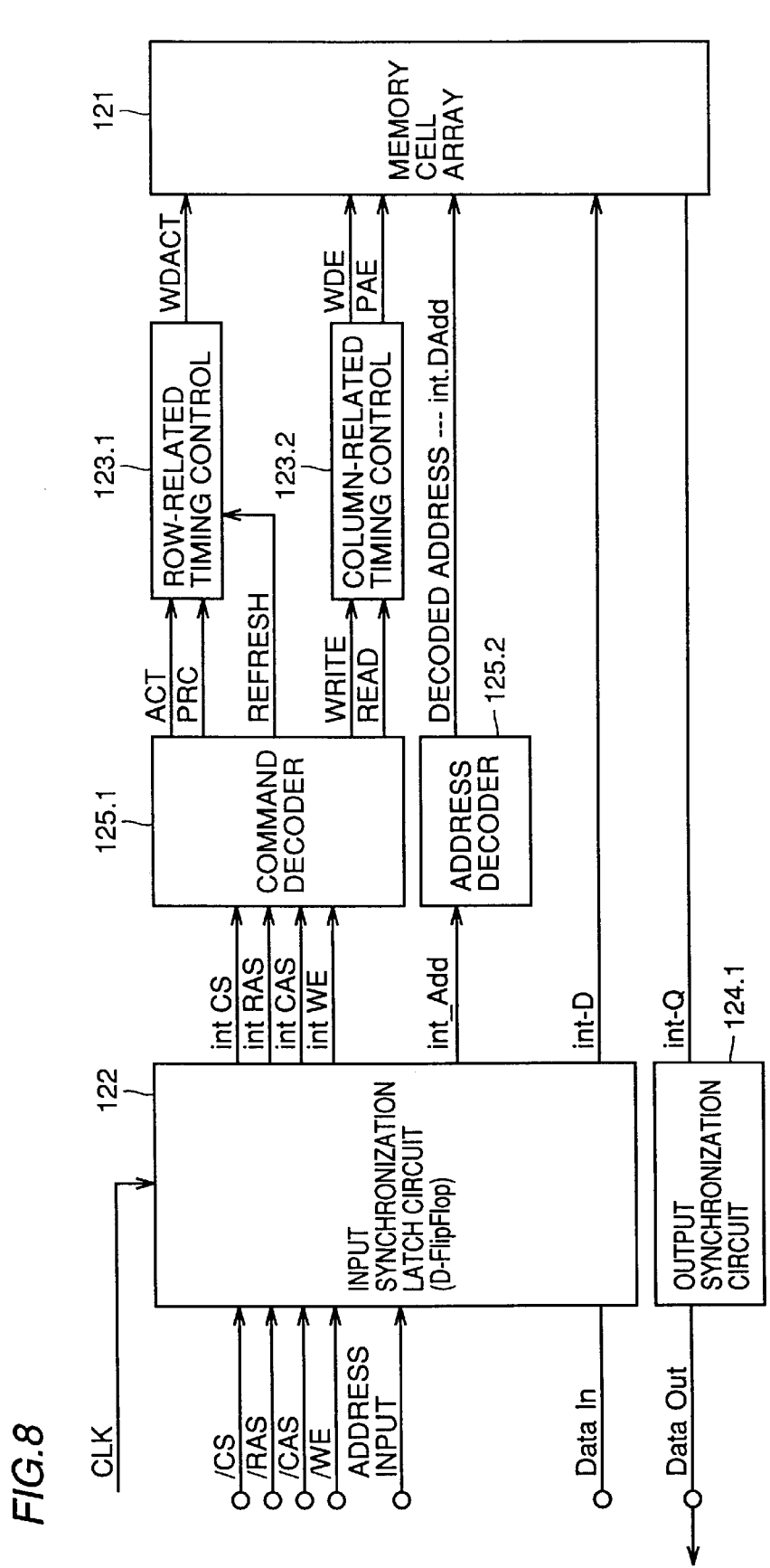
FIG. 8 is a schematic block diagram showing paths, through which externally applied control signals are converted into internal control signals and are applied to a memory cell array 121 in a one-chip general-purpose SDRAM.

First, description will be given on the transmission path of control signals of one-chip general-purpose SDRAM. FIG. 8 is a schematic block diagram showing paths in the one-chip general-purpose SDRAM, through which externally applied control signals /CS, /RAS, /CAS and /WE as well as the address input are converted to internal control signals, and are applied to memory cell array 121.

Referring to FIG. 8, input synchronization latch circuit 122 which operates in synchronization with clock signal CLK takes in control signals /CS, /RAS, /CAS and /WE as well as the address input, which are applied through external control signal input terminal 101. Input synchronization latch circuit 122 converts the externally applied control signals to internal control signals int.CS, int.RAS, int.CAS and int.WE for output, and also converts the address input to internal address signal int.Add for output.

A command decoder 125.1 receives internal control signals int.CS, int.RAS, int.CAS and int.WE, and converts them to internal control signals ACT, PRC, REF, WRITE and READ. An address decoder 125.2 receives internal address signal int.Add, and outputs decoded address signal int.DAdd.

A timing control circuit 123.1 related to rows receives internal control signals ACT, PRC and REF, and applies a word line activating signal WDACT to memory cell array 121.

A timing control circuit 123.2 related to columns receives internal control signals WRITE and READ, and applies write driver activating signal WDE or read amplifier activating signal PAE to memory cell array 121 depending on the operation to be done (i.e., write or read operation).

Depending on the decoded address int.DAdd applied from address decoder 125.2, data is read out from the selected memory cell in memory cell array 121, or data is written into the selected memory cell. The input data to be written is processed as follows. Data DataIn applied to input synchronization latch circuit 122 is converted into internal write signal int-D, and is applied to memory cell array 121. Internal read data int-Q read from memory cell array 121 is externally output as output data DataOUT via output synchronization circuit 124.

Figure 9:
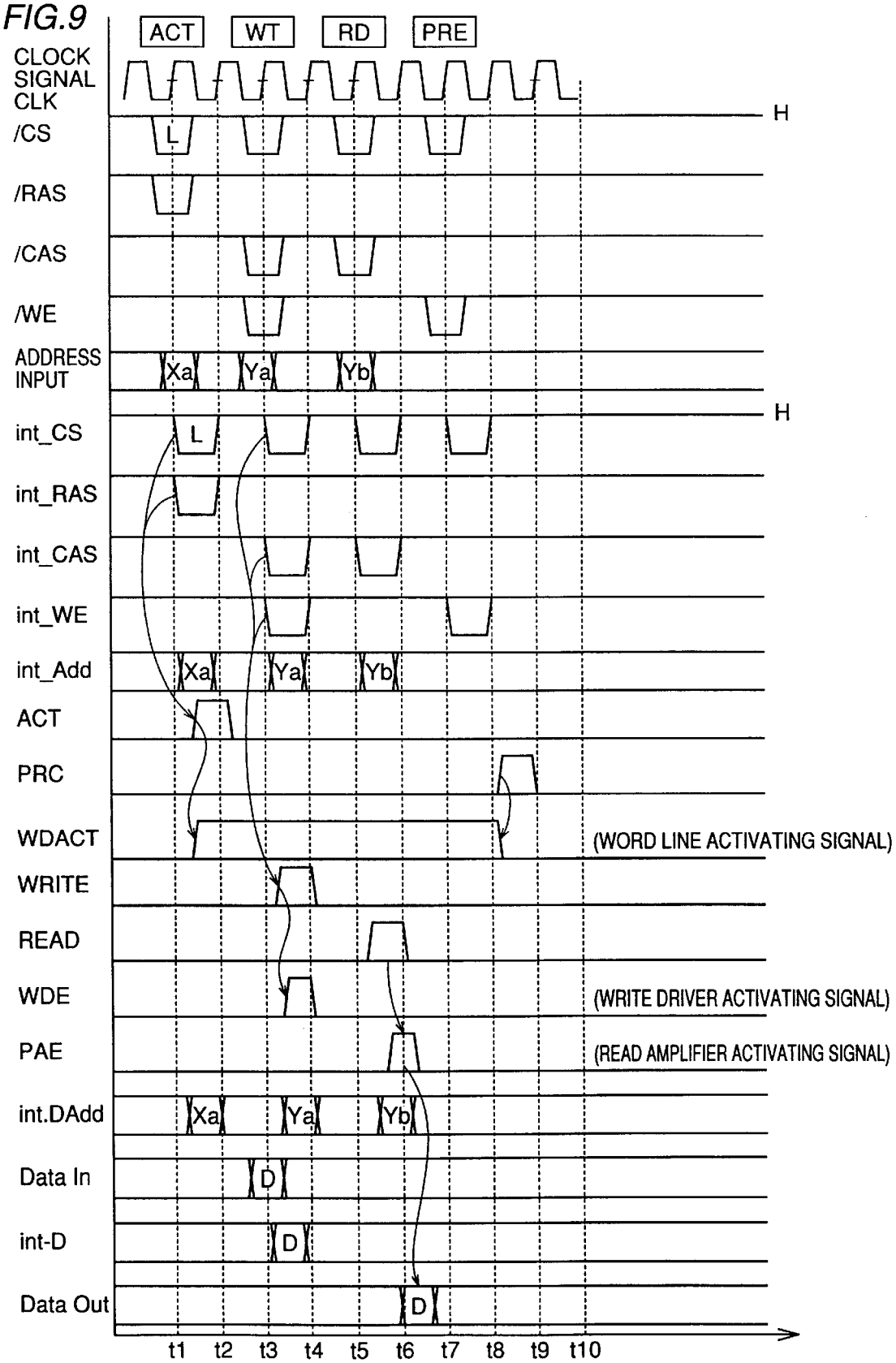
FIG. 9 is a timing chart for showing an operation of the one-chip SDRAM shown in FIG. 8.

FIG. 9 is a timing chart showing operations of the one-chip SDRAM shown in FIG. 8.

At time t1 of the rising edge of clock signal CLK, internally applied control signals /CS and /RAS are both active (i.e., at "L" level), and thereby activation of the SDRAM is instructed. At the same time (i.e., at time t1), row address signal Xa is applied to input synchronization latch circuit 122.

In response to the active state of signals /CS and /RAS, input synchronization latch circuit 122 issues active internal control signals int.CS and int.RAS, and also issues internal row address signal int.Add.

In response to activation (setting to "L" level) of signals int.CS and int.RAS, command decoder 125.1 outputs active control signal ACT, and thereby row-related timing control circuit 123.1 outputs word line activating signal WDACT in the active state.

In memory cell array 121, a row decoder (not shown) selects the word line corresponding to the decoded address sent from address decoder 125.2 in accordance with the same timing as activation of signal WDACT.

At a subsequent time t3 of the rising edge of clock signal CLK, the data write operation is designated in response to the fact that externally applied signals /CS, /CAS and /WE are all active (at "L" level). At this time t3, column address signal Ya for data writing is externally applied.

In response to the activation of external control signals /CS, /CAS and /WE, address synchronization latch circuit 122 issues active internal control signals int.CS, int.CAS and int.WE, and also issues internal address signal int.Add. Command decoder 125.1 activates internal control signal WRITE in response to activation of signals int.CS, int.CAS and int.WE. Column-related timing control circuit 123.2 is activated in response to activation of signal WRITE, and internal write data int-D is supplied from input synchronization latch circuit 122 for the column in the memory cell array selected by the decoded address issued from address decoder 125.2, and is written into the selected memory cell in accordance with activation of signal WDE.

At a subsequent time t5 of the edge of activation of clock signal CLK, externally applied control signals /CS and /CAS are activated, and the data read mode is designated in accordance with this activation of signals /CS and /CAS. At time t5, input synchronization latch circuit 122 is supplied with column address Yb for data reading.

Input synchronization latch circuit 122 issues internal control signals int.CS and int.CAS in the active state in response to the activation of signals /CS and /CAS. Further, input synchronization latch circuit 122 applies internal address signal int.Add to address decoder 125.2 in response to column address signal Yb at time t5.

In response to activation of signals int.CS and int.CAS, command decoder 125.1 activates internal control signal READ, and column-related timing control circuit 123.2 activates read amplifier activating signal in response to this activation of internal control signal READ. In response to this activation of signal PAE, data is read out from the memory cell selected in accordance with the decoded address, which is issued from address decoder 125.2, and is applied as internal read data int-Q to output circuit 124. At a time t6, it is externally output as output data DataOUT.

At a time t7 of the rising edge of clock signal CLK, externally applied control signals /CS and /WE are both activated. In response to this, input synchronization latch circuit 122 activates signals int.CS and int.WE. Command decoder 125.1 activates precharge signal PRC in accordance with activation of signals int.CS and int.WE. Row-related timing control circuit 123.1 drives word line activating signal WDACT to the inactive state ("L" level) in response to activation of signal PRC.

As can be seen from the foregoing operations, the one-chip SDRAM is configured to perform the control as follows. After the combination of the levels of general-purpose SDRAM control signals is taken into input synchronization latch circuit 122 in accordance with the activation edge of clock signal CLK, command decoder 125.1 issues the internal control signals in accordance with the output manner or output structure of input synchronization latch circuit 122, and the control is performed for read operation or write operation for memory cell array 121 in response to the internal control signals thus issued from command decoder 125.1.

Figure 10:
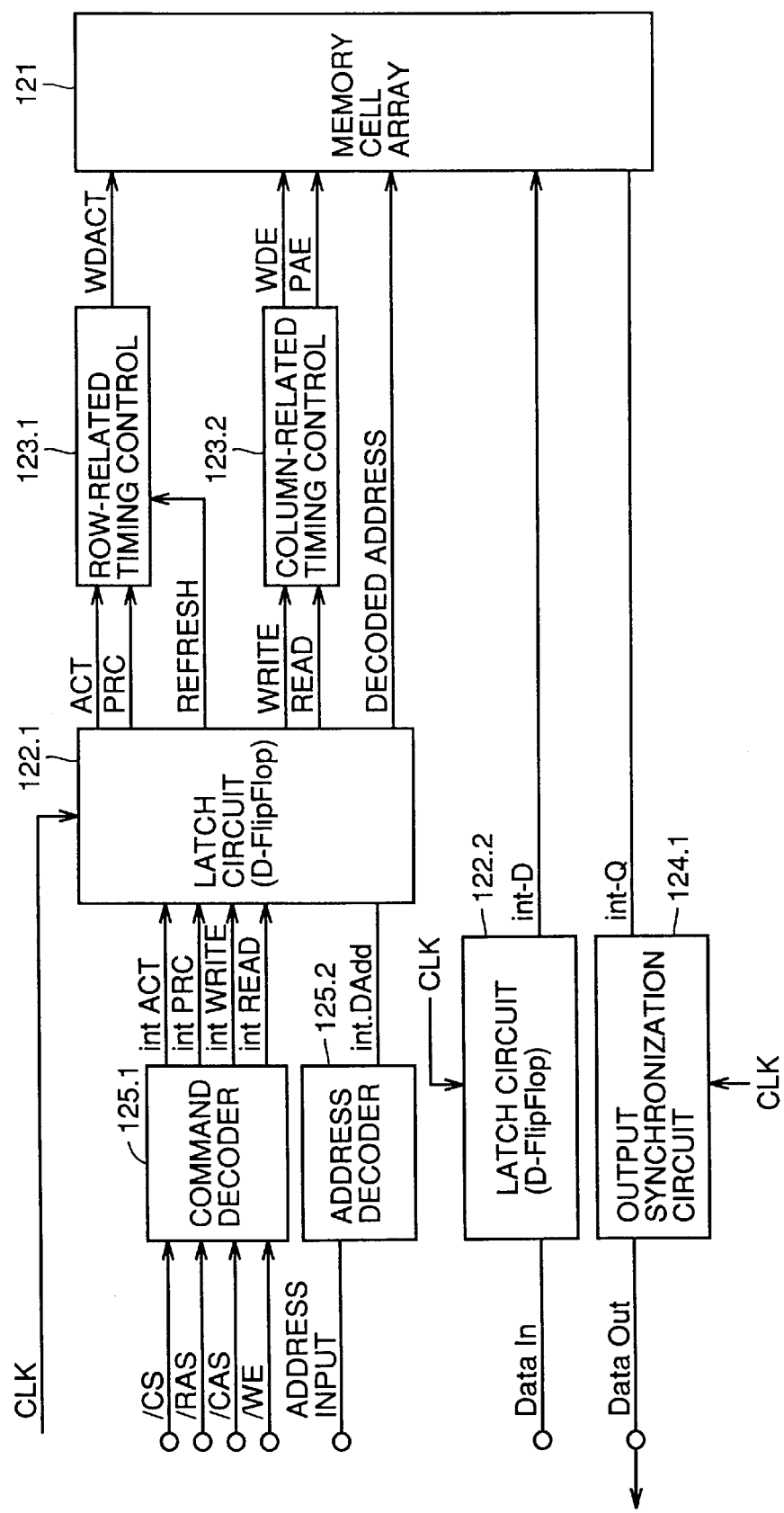
FIG. 10 is a schematic block diagram showing the structure of semiconductor integrated circuit device 1000, and particularly a portion operating in accordance with a general-purpose SDRAM control signal.

FIG. 10 is a schematic block diagram showing a structure of semiconductor integrated circuit device 1000 shown in FIG. 1, and particularly shows a structure including first command decoder circuit 125, internal synchronization latch circuit 122, memory cell array control circuit 123 and output circuit 124, which operate in accordance with the general-purpose SDRAM control signals sent from general-purpose SDRAM controller 103.

In FIG. 10, input select circuit 127 shown in FIG. 1 is not shown for simplicity reason.

Compared with the structure in FIG. 8, the structure in FIG. 10 has such a difference that the general-purpose SDRAM control signal applied from general-purpose SDRAM controller 103 is first applied to command decoder 125.1 and address decoder 125.2 in first command decoder circuit 125, and then is latched by internal control signal latch circuit 122.1, which is included in input synchronization latch circuit 122 and operates in synchronization with clock signal CLK.

Input data DataIn sent from general-purpose SDRAM controller 103 is latched by data latch circuit 122.2, which is included in input synchronization latch circuit 122, and operates in synchronization with clock signal CLK, and is applied as data int-D to memory cell array 121. Row-related timing control circuit 123.1 receives internal control signals ACT, PRC and REF from internal control signal latch circuit 122.1, and applies word line activating signal WDACT to memory cell array 121. Column-related timing control circuit 123.2 receives internal control signals WRITE and READ from internal control signal latch circuit 122.1, and applies write driver activating signal WDE or read amplifier activating signal PAE to memory cell array 121 depending on the operation to be done (i.e., write operation or read operation). Data int-Q read from memory cell array 121 is latched by output synchronization circuit (i.e., circuit for output synchronization) 124.1, which is included in output circuit 124, and operates in synchronization with clock signal CLK, and is issues as data DataOut to general-purpose SDRAM controller 103.

Figure 11:
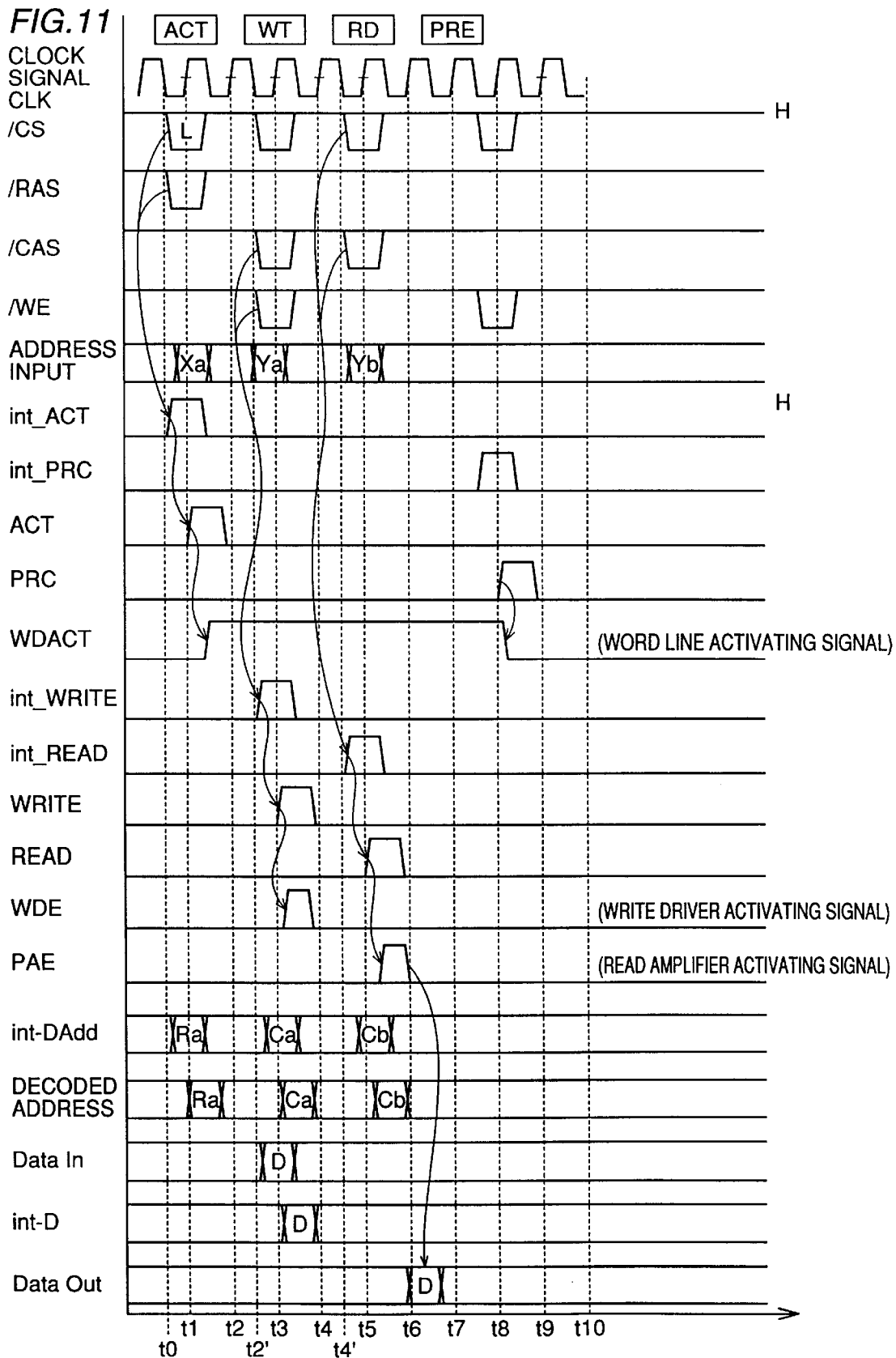
FIG. 11 is a timing chart showing an operation of a DRAM core 104 shown in FIG. 10.

FIG. 11 is a timing chart for showing operations of DRAM core 104 shown in FIG. 10.

At time t0, signals /CS and /RAS among the general-purpose SDRAM control signals applied from general-purpose SDRAM controller 103 become active. In response to this activation, internal control signal int.ACT sent from command decoder 125.1 changes its state to the active state. Further, at time t0, address decoder 125.2 is supplied with row address signal Xa, and decoded internal address signal int.DAdd is issued from address decoder 125.2.

Subsequently, at time t1 of the rising edge of clock signal CLK, latch circuit 122.1 changes internal control signal ACT to the active state in response to the active state of int.ACT sent from the command decoder. In response to this, row-related timing control circuit 123.1 changes word line activating signal WDACT to the active state.

As can be apparent from comparison with FIG. 9, the time delay from the rising edge of clock signal CLK to the activation of the word line activating signal is reduced in the operations shown in FIG. 11.

Likewise, command decoder 125.1 activates signal int.WRITE in response to the activation of signals /CS, /CAS and /WE sent from general-purpose SDRAM controller 103.

At a time t2', general-purpose SDRAM controller 103 sends the address signal to address decoder 125.2. In response to this, address decoder 125.2 issues internal decoded address signal int-DAdd.

When clock signal CLK is activated at time t3, latch circuit 122.1 activates internal control signal WRITE in response to the fact that signal int.WRITE is active. In response to this, column-related timing control circuit 123.2 drives write driver activating signal WDE to the active state ("H" level).

Input synchronization latch circuit 122 receives internal decoded address signal int.DAdd from address decoder 125.2, and starts the decoding to issue decoded address Ca. Write data DataIN applied to latch circuit 122.2 from general-purpose SDRAM controller 103 is converted to internal write signal int-D in response to the activation edge of clock signal CLK at time t3, and is written into the memory cell column selected by decoded address Ca in response to the activation of signal WDE.

Further, at a time t4', signals /CS and /CAS applied from general-purpose SDRAM controller 103 to command decoder 125.1 are active. In response to this, command decoder 125.1 changes internal control signal int.READ to the active state.

At time t4', address decoder 125.2 is supplied with address input Yb. In response to this, address decoder 125.2 issues internal decoded address signal int-DAdd.

At time t5 of the activation edge of signal CLK, latch circuit 122.1 activates internal control signal READ in response to the active state of signal int.READ. In response to this, column-related timing control circuit 123.2 activates read amplifier activating signal PAE. In response to the activation of signal PAE, internal read data int-Q is read from the memory cell column which is selected by decoded address Cb sent from latch circuit 122.1, and is output as signal DataOUT from output synchronization circuit 124.1.

As described above, semiconductor integrated circuit device 1000 shown in FIG. 1 can increase operations margins for both the write and read operations because the general-purpose SDRAM control signals applied from the general-purpose SDRAM controller are first applied to command decoder circuit 125, and the decoding operation of command decoder circuit 125 is performed prior to the latch operation of input synchronization latch circuit 122. In other words, semiconductor integrated circuit device 1000 is adaptable to faster operations.

[Second Embodiment]

Figure 12:
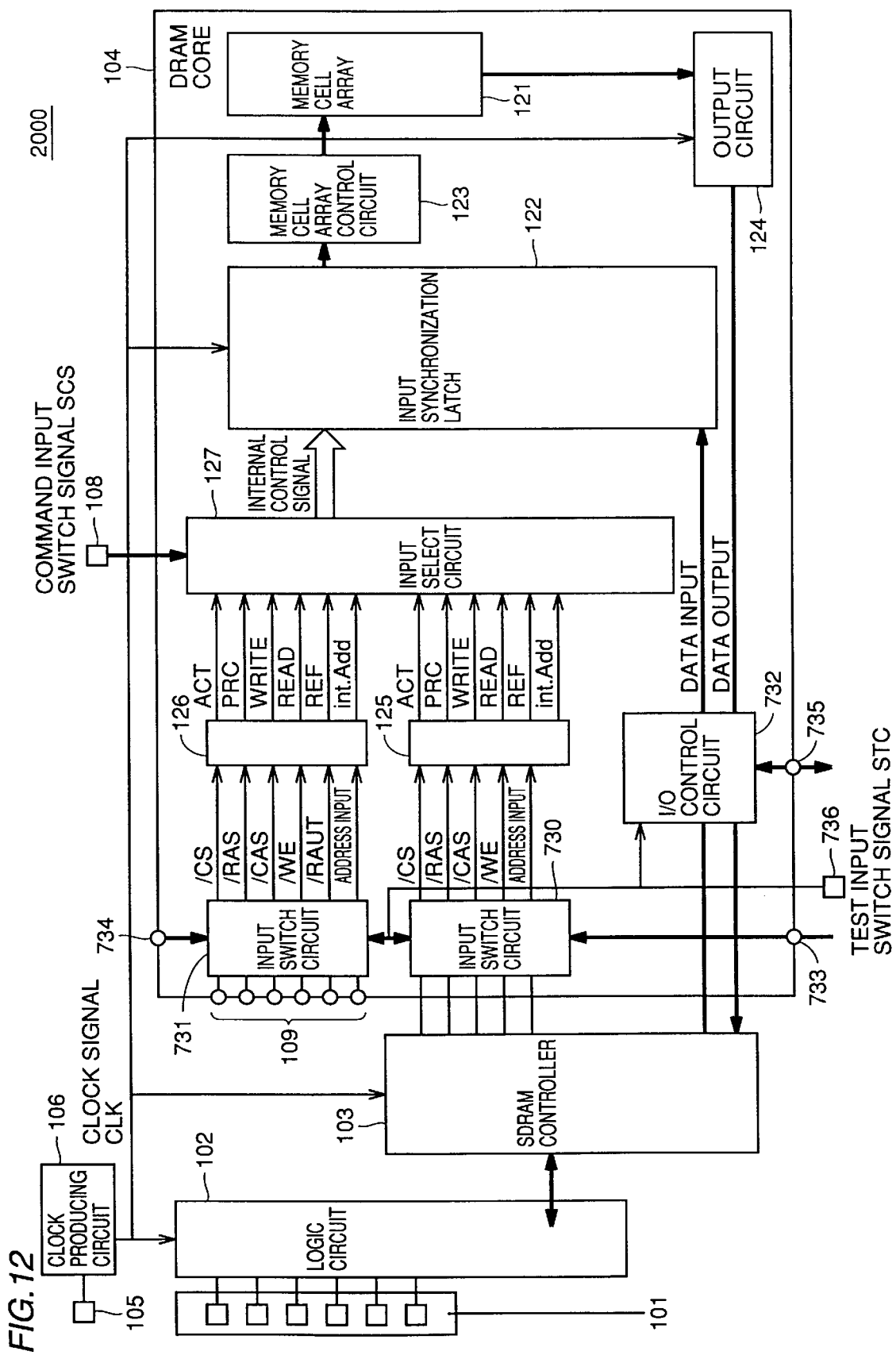
FIG. 12 is a schematic block diagram showing a structure of a semiconductor integrated circuit device 2000 of a second embodiment of the invention.

FIG. 12 is a schematic block diagram showing a structure of a semiconductor integrated circuit device 2000 of a second embodiment of the invention.

The structure of semiconductor integrated circuit device 2000 shown in FIG. 12 differs from that of semiconductor integrated circuit device 1000 shown in FIG. 1 in the following points.

In semiconductor integrated circuit device 2000, an input switch circuit 730 is arranged between general-purpose SDRAM controller 103 and first command decoder circuit 125. Input switch circuit 730 receives signals sent from a test command input terminal group 733 as well as signals sent from general-purpose SDRAM controller 103, and selects the signals sent from the test command input terminal group 733 or the signals sent from general-purpose SDRAM controller 103 for applying the selected signals to first command decoder circuit 125 in response to a test input switch signal STC sent from a switch signal input terminal 736.

Further, semiconductor integrated circuit device 2000 is provided with an input switch circuit 731, which receives the signals sent from test command input terminal group 734 or the potential levels on EDO-DRAM command input nodes 109, and applies the received signals or potential levels to second command decoder circuit 126 in response to test input switch signal STC applied to switch signal input terminal 736.

Further, semiconductor integrated circuit device 2000 is provided with an I/O control circuit 732 arranged between on the one hand, general-purpose SDRAM controller 103, and on the other hand, input synchronization latch circuit 122 and output circuit 124. I/O control circuit 732 selectively applies the test data applied from test data I/O terminal group 735 and input data applied from general-purpose SDRAM controller 103 to input synchronization latch circuit 122 in accordance with test input switch signal STC applied from switch signal input terminal 736. Further, I/O control circuit 732 applies the data output from output circuit 124 to general-purpose SDRAM controller 103 or test data I/O terminal group 735 in accordance with switch signal STC.

Structures other than the above are the substantially same as those of semiconductor integrated circuit device 1000 shown in FIG. 1. The corresponding portions bear the same reference numbers, and description thereof is not repeated.

Referring to FIG. 12, command input switch signal SCS is fixed at "H" level so that input select circuit 127 is set to apply selectively the signals sent from first command decoder circuit 125 to input synchronization latch circuit 122.

In the test operation, the test input switch signal is also fixed at "H" level so that input switch circuit 730 is set to apply selectively the signals sent from test command input terminal group 733 to first command decoder circuit 125.

In the test operation, therefore, the signals supplied through test command input terminal group 733 are converted when they pass through input select circuit 730, first command decoder circuit 125, input select circuit 127, input synchronization latch circuit 122 and memory cell array control circuit 123, and are applied to memory cell array 121.

Further, in the test operation, data is input from test data I/O terminal 735, and is applied to memory cell array 121 through I/O control circuit 732 and input synchronization latch circuit 122. Data read from memory cell array 121 is applied from output circuit 124 to I/O control circuit 732, and is output from test data I/O terminal 735.

Owing to the above structures, only the operation of DRAM core 104 can be verified independently of logic circuit 102 and general-purpose SDRAM controller 103 during the test operation period.

Figure 13:
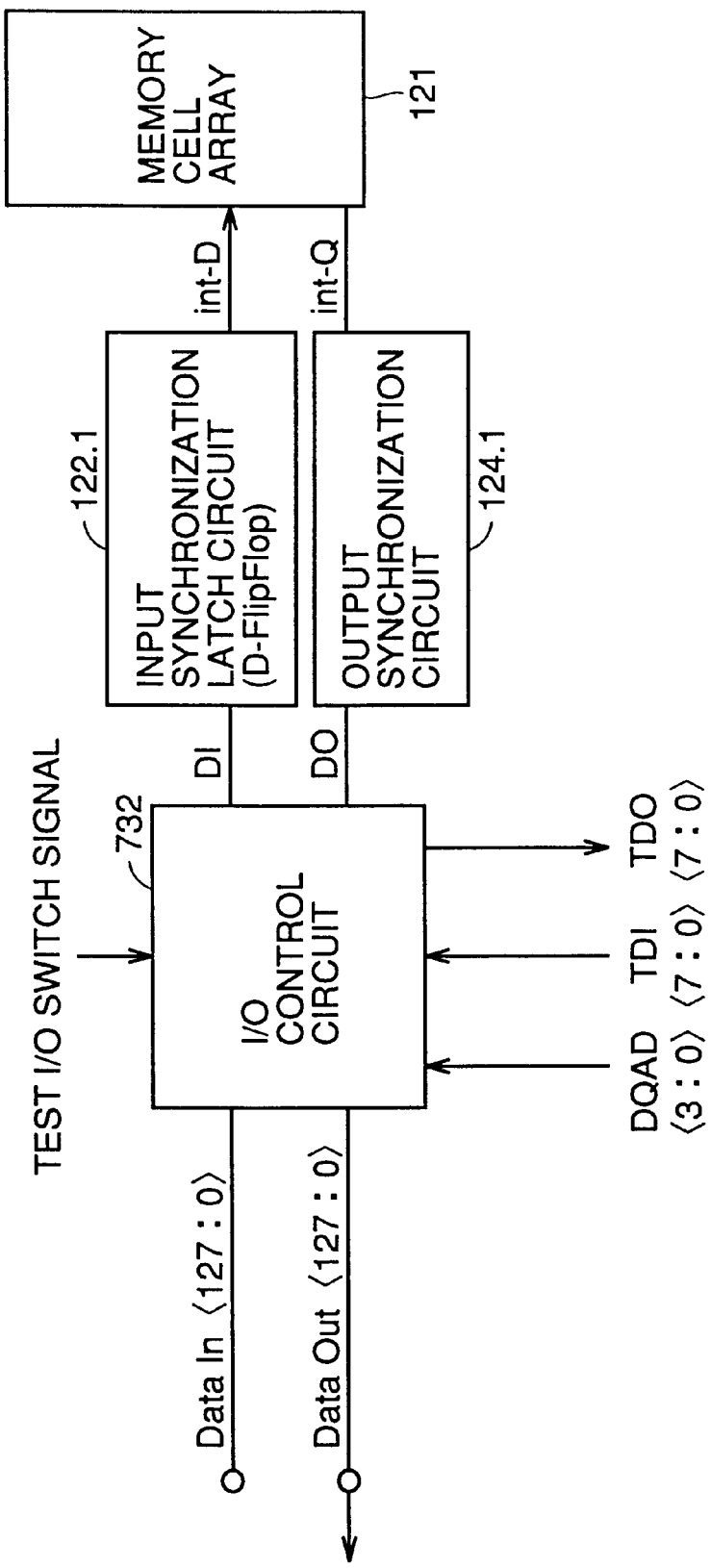
FIG. 13 is a schematic block diagram showing only portions related to input/output of data.

FIG. 13 is a schematic block diagram fragmentarily showing the structures of I/O control circuit 732, input synchronization latch circuit 122 and output circuit 124 shown in FIG. 12, and particularly shows only a portion related to the input/output of data. I/O control circuit 732 is supplied with DataIN<127:0> of 128 bits as input data from general-purpose SDRAM controller 103, and applies it as internal write data int-D to memory cell array 121 via input synchronization latch circuit 122.1.

Internal read data int-Q read from memory cell array 121 is applied to I/O control circuit 732 via output synchronization circuit 124.1 in output circuit 124. In the normal operation, this data is applied as output data DataOUT<127:0> of 128 bits to general-purpose SDRAM controller 103.

I/O control circuit 732 receives test input switch signal STC sent from switch signal input terminal 736 as well as an output select signal DQAD<3:0> and test input signal TDI<7:0> sent from test data I/O terminal 735. During the test period, I/O control circuit 732 applies test read data TDO<7:0> to test data I/O terminal 735.

Figure 14:
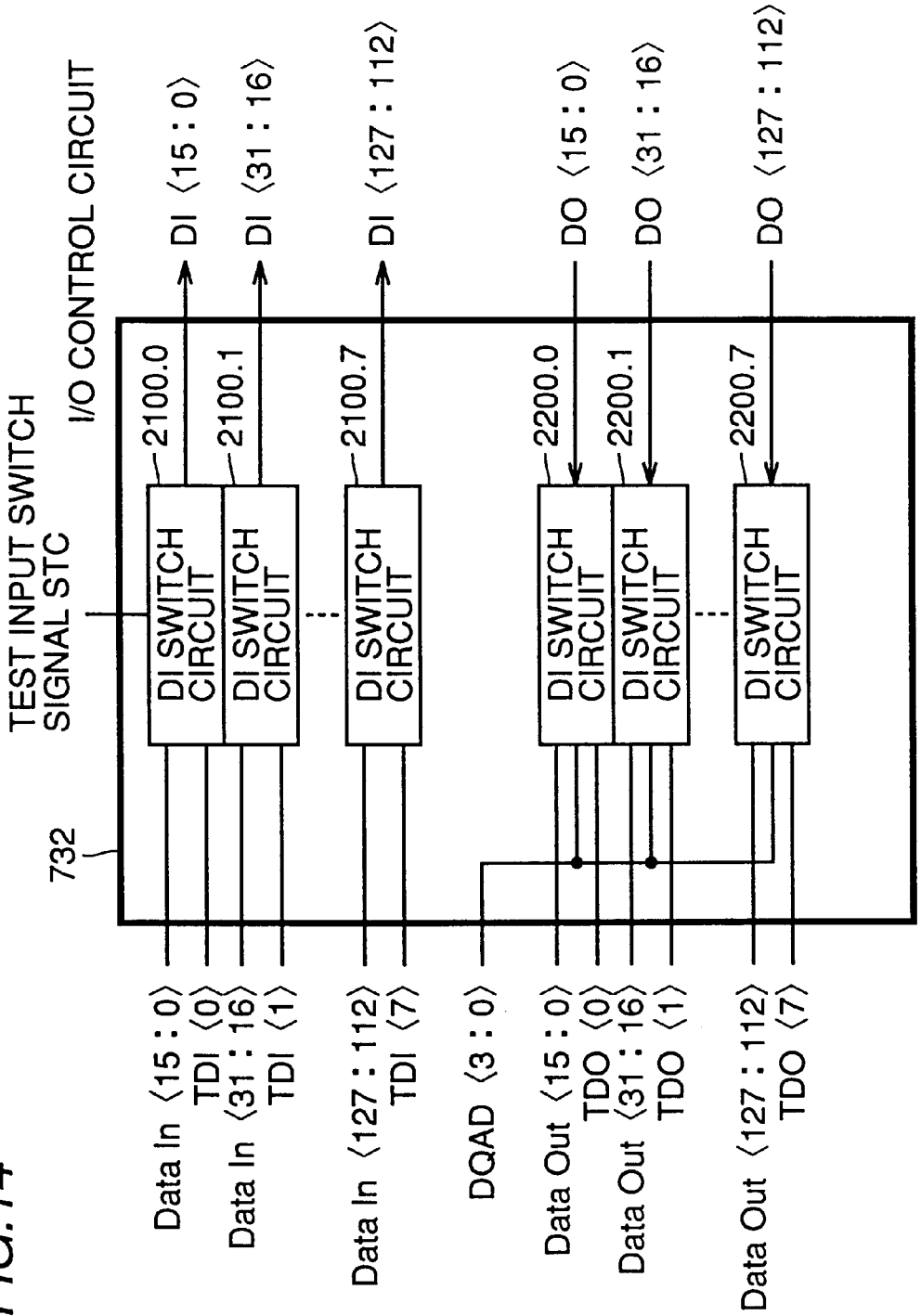
FIG. 14 is a schematic block diagram showing a structure of an I/O control circuit 732 shown in FIG. 13 in greater detail.

FIG. 14 is a schematic block diagram showing the structure of I/O control circuit 732 shown in FIG. 13 in greater detail.

I/O control circuit 732 includes a DI switch circuit 2100.0, which is controlled by test input switch signal STC, receives data DataIN<15:0> of 16 bits sent from general-purpose SDRAM controller 103 and test data TDI<0> sent from test data I/O terminal 735, and applies input data DI<15:0> to input synchronization latch circuit 122 based on either of the received data. I/O control circuit 732 also includes DI switch circuits 2100.1–2100.7 which correspond to other 16-bit data DataIn<31:16>–DataIN<127:112> as well as corresponding test data TDI<1>–TDI<7>, respectively.

DI switch circuits 2100.1–2100.7 are likewise controlled by test input switch signal STC, and apply input data DI<31:16>–DI<12:112> to input synchronization latch circuit 122.

I/O control circuit 732 includes a DO select circuit 2200.0, which receives read data DO<15:0> from memory cell array 121 for applying the data selected by signal DQAD<3:0> as signal TDO<0> to test data I/O terminal 735, or applying read data DataOUT<15:0> to general-purpose SDRAM controller 103.

I/O control circuit 732 also includes DO select circuits 2200.1–2200.7 corresponding to 16-bit data DO<31:16>–DO<127:112>, respectively.

DO switch circuits 2200.1–2200.7 issue the data selected by signal DQAD<3:0> to test data I/O terminal 735 as signals TDO<1>–TDO<7>, or apply read data DataOut<31:16>–DataOut<127:112> to general-purpose SDRAM controller 103, respectively.

Figure 15:
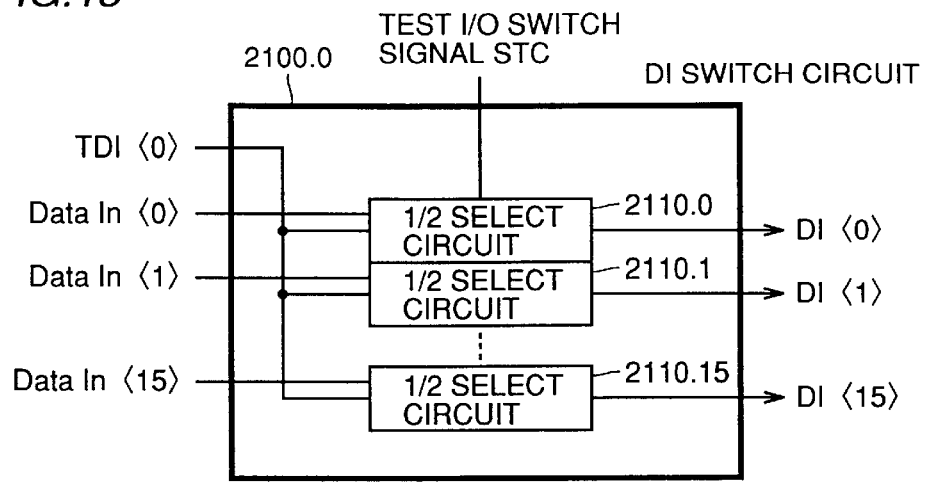
FIG. 15 is a schematic block diagram showing a structure of a DI switch circuit 2100.0 shown in FIG. 14.

FIG. 15 is a schematic block diagram showing a structure of DI switch circuit 2100.0 shown in FIG. 14.

DI switch circuit 2100.0 includes a ½ select circuit 2110.0, which is controlled by test I/O switch signal STC, receives data TDI<0> sent from test data I/O terminal 735 and data DataIn<0> sent from general-purpose SDRAM controller 103, and selects one of them for outputting it as data DI<0>.

DI switch circuit 2100.0 further includes ½ select circuits 2110.1–2110.15, which correspond to input data DataIn<1>–DataIn<15>, respectively, and each have a structure similar to that of ½ select circuit 2110.0.

Other DI switch circuits 2100.1–2100.7 have structures which are basically similar to that of DI switch circuit 2100.0.

Figure 16:
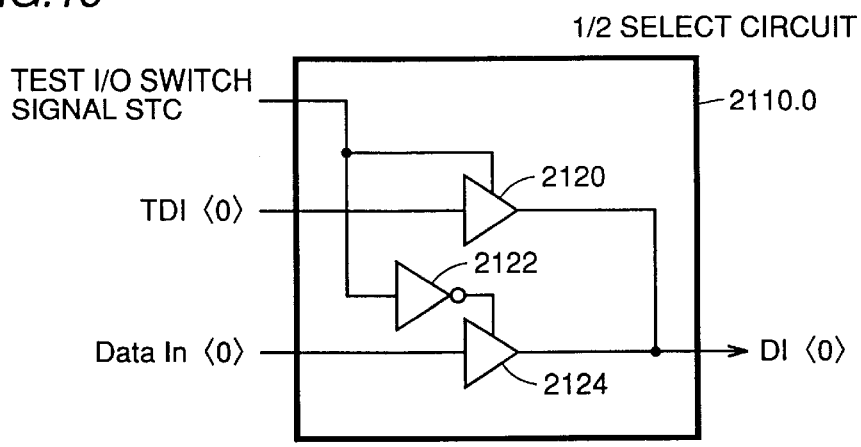
FIG. 16 is a circuit diagram showing a structure of a ½ select circuit 2110.0 shown in FIG. 15.

FIG. 16 is a circuit diagram showing ½ select circuit 2110.0 shown in FIG. 15.

½ select circuit 2110.0 includes a driver circuit 2120 which receives data TDI<0>, and is activated in response to test input switch signal STC, an inverter 2122 which receives and inverts test input switch signal STC for output, and a driver circuit 2124 which receives signal DataIN<0>, and outputs it as Data DI<0>.

When test input switch signal STC is active, the output of driver circuit 2120 is issued as data DI<0>. When test input switch signal STC is inactive, the output of driver circuit 2124 is issued as data DI<0>.

Figure 17:
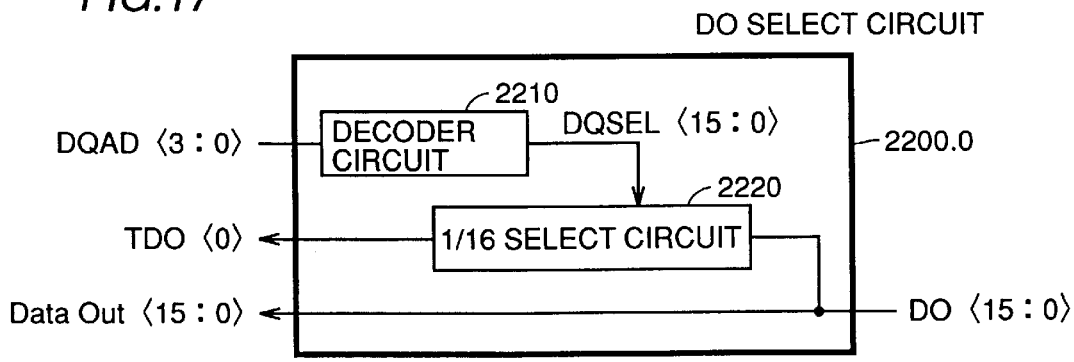
FIG. 17 is a schematic block diagram showing a structure of a DO select circuit 2200.0 shown in FIG. 14.

FIG. 17 is a schematic block diagram showing a structure of DO select circuit 2200.0 shown in FIG. 14.

Referring to FIG. 17, DO select circuit 2200.0 includes a decoder circuit 2210 which receives and decodes signal DQAD<3:0> for issuing a signal DQSEL<15:0> for selecting the output data, and a ¹⁄₁₆ select circuit 2220 which receives 16-bit data DO<15:0> among the outputs of output synchronization circuit 124.1, and applies it as signal TDO<0> to test data I/O terminal 735 under the control of signal DQSEL<15:0>.

FIG. 18 shows a decoding operation of decoder circuit 2210 shown in FIG. 17.

In accordance with a value of data DQAD<3:0> of 4 bits, one of bit data of DQSEL<15:0> is selectively set to the active state ("H" level).

Figure 19:
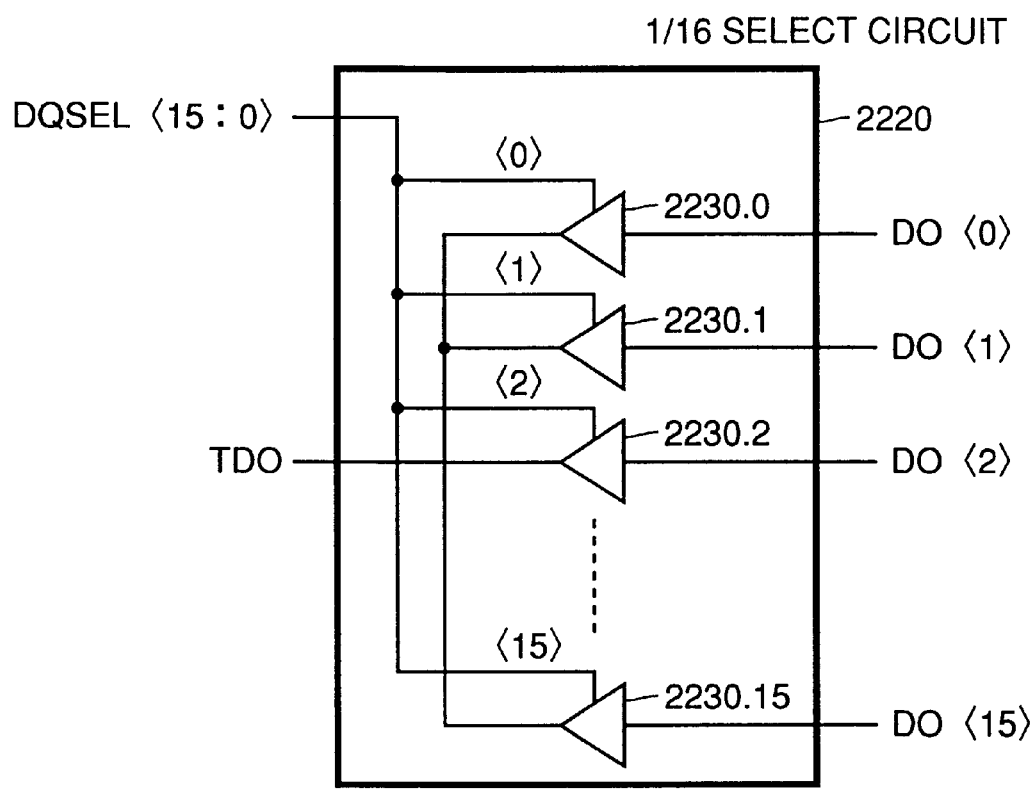
FIG. 19 shows a structure of a 1/16 select circuit 2210 shown in FIG. 17.

FIG. 19 is a circuit diagram showing a structure of ¹⁄₁₆ select circuit 2210 shown in FIG. 17.

¹⁄₁₆ select circuit 2210 includes driver circuits 2230.0–2230.15, which receive bit data DO<0>–DO<15> of data DO<15:0>, respectively. Driver circuits 2230.0–2230.15 are activated in response to activation of the respective bit data of signal DQSEL<15:0>.

The outputs of driver circuits 2230.0–2230.15 are applied to test data I/O terminal 735 as test data TDO.

Figure 20:
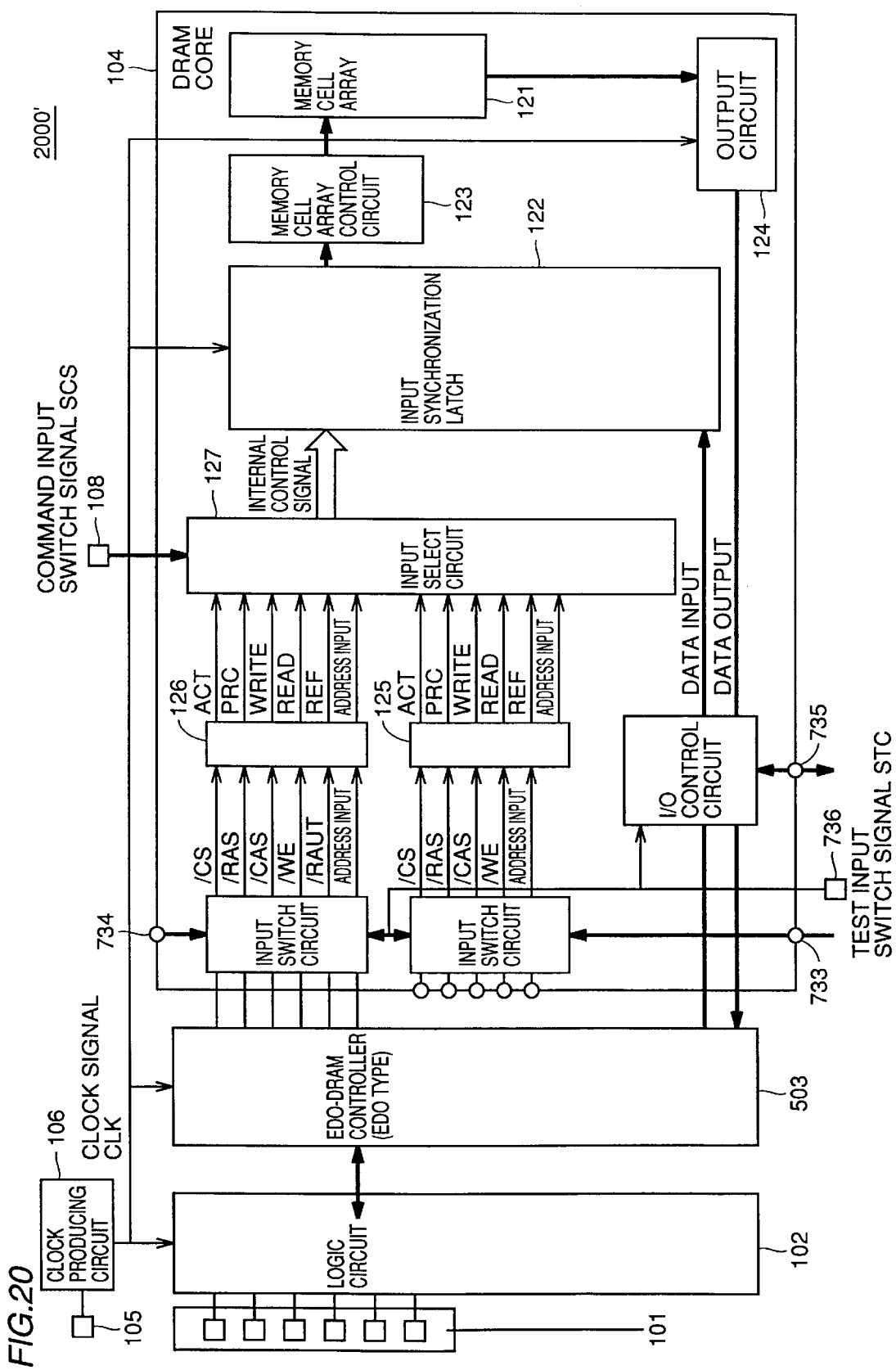
FIG. 20 is a schematic block diagram showing a structure of a semiconductor integrated circuit 2000' of the second embodiment of the invention.

FIG. 20 is a schematic block diagram showing a structure of a semiconductor integrated circuit device 2000' of the second embodiment of the invention.

The structure of semiconductor integrated circuit device 2000' shown in FIG. 20 differs from the structure of semiconductor integrated circuit device 2000 shown in FIG. 12 in that a logic circuit 502 is employed instead of logic circuit 102, a general-purpose EDO-DRAM controller 503 is employed instead of general-purpose SDRAM controller 103, and the output of general-purpose EDO-DRAM controller 503 is applied to input switch circuit 731.

Structures other than the above are the substantially same as those of semiconductor integrated circuit device 2000 shown in FIG. 12. The corresponding portions bear the same reference numbers, and description thereof is not repeated.

Owing to the structure shown in FIG. 20, no change in design data is required for DRAM core 104, and DRAM core 104 can be operated as a clock synchronous EDO-DRAM core. The circuit structure of clock synchronous EDO-DRAM controller 503 can be designed in advance corresponding to the EDO-DRAM core. Even if logic circuit 502 is designed on the assumption that the general-purpose clock synchronous EDO-DRAM operates as a memory, the structure can be easily changed from that in FIG. 12 into that in FIG. 20 by registering in advance the logic circuit part and the DRAM controller part as the design libraries, respectively.

[Third Embodiment]

Figure 21:
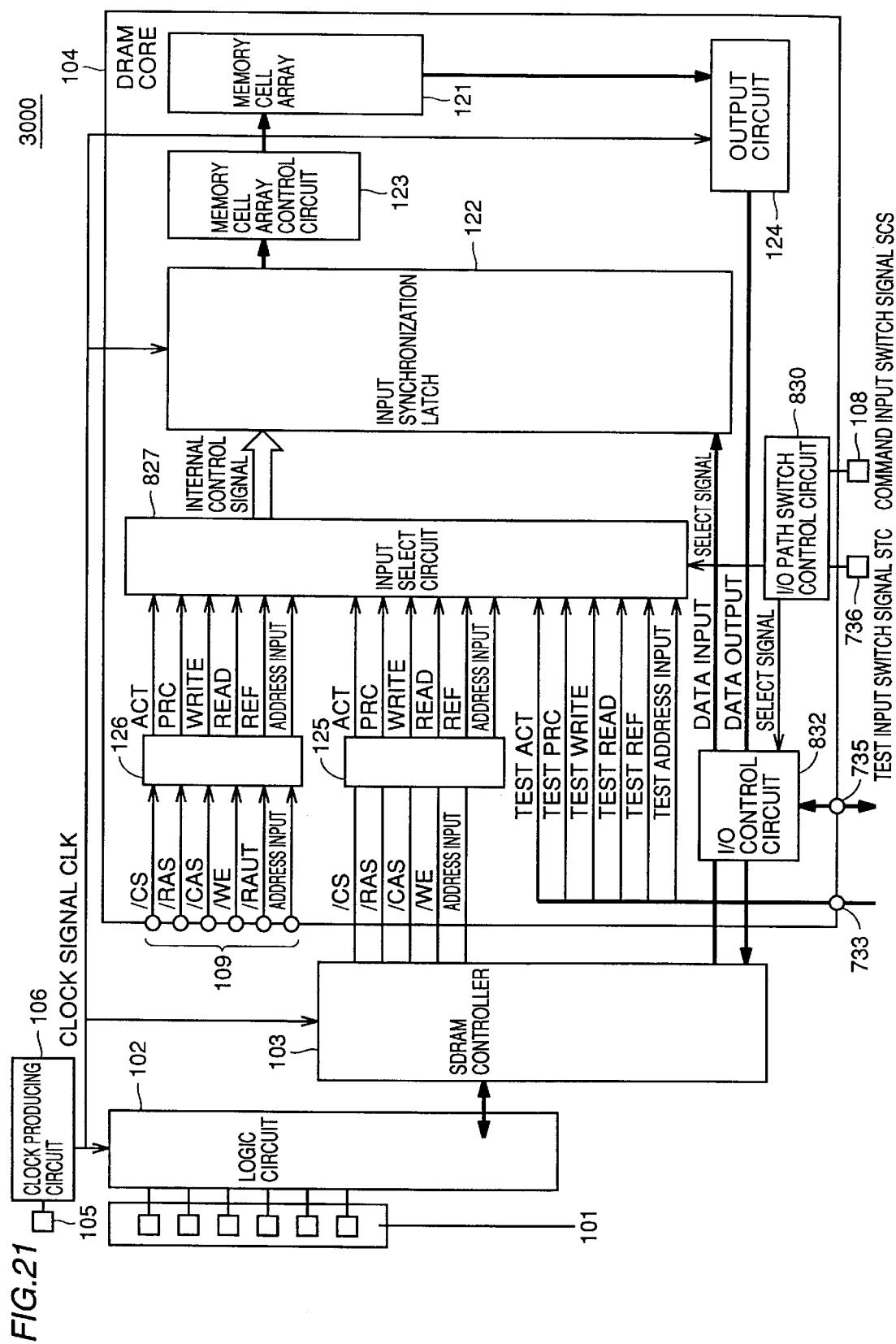
FIG. 21 is a schematic block diagram showing a structure of a semiconductor integrated circuit device 3000 of a third embodiment of the invention.

FIG. 21 is a schematic block diagram showing a structure of a semiconductor integrated circuit device 3000 of a third embodiment of the invention.

The structure of semiconductor integrated circuit device 3000 of the third embodiment differs from the structure of semiconductor integrated circuit device 2000 of the second embodiment shown in FIG. 12 in that input switch circuits 730 and 731 are eliminated, the test control signals applied from test command input terminal group 733 are directly applied to an input select circuit 827, an I/O path switch control circuit 830 is employed for controlling input select circuit 827 and I/O control circuit 832 in accordance with test input switch signal STC and command input switch signal SCS, and an I/O control circuit 832 is employed instead of I/O control circuit 732.

In the foregoing second embodiment, I/O control circuit 732 is configured to switch the paths of data input/output in accordance with test input switch signal STC. In the third embodiment, however, I/O control circuit 832 is configured to operate in accordance with a select signal SD sent from I/O path switch control circuit 830, as will be described later.

Structures other than the above are the substantially same as those of semiconductor integrated circuit device 2000 of the second embodiment. The corresponding portions bear the same reference numbers, and description thereof is not repeated.

Figures 22, 23:
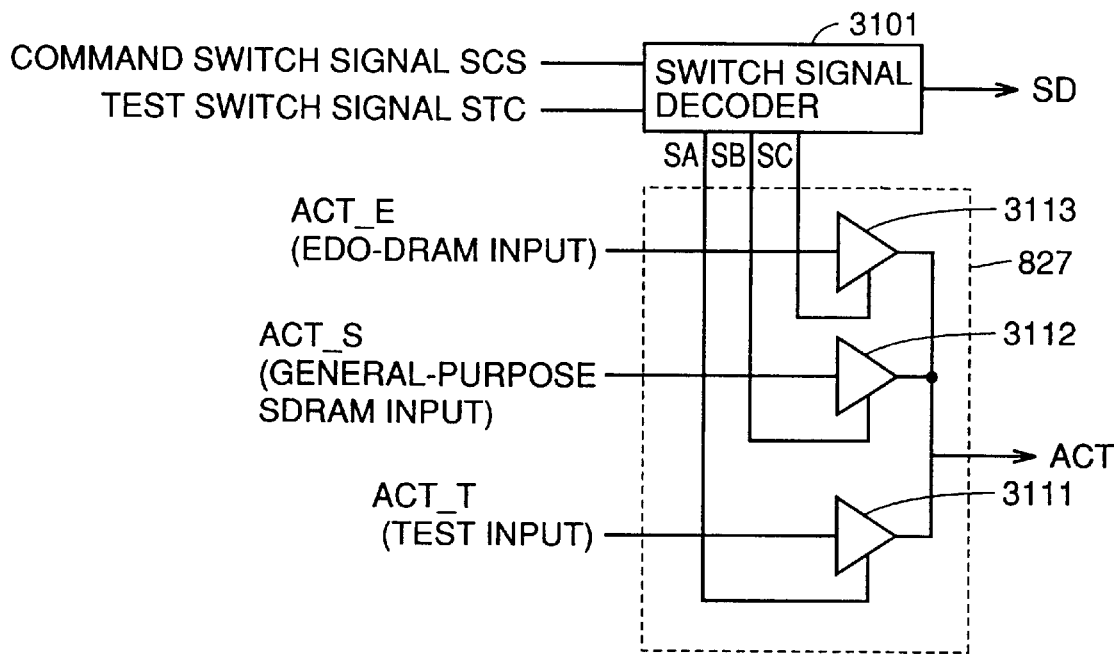
FIG. 22 is a schematic block diagram showing a structure of an I/O path switch control circuit and an input select circuit 827 shown in FIG. 21.
FIG. 23 shows an operation of a switch signal decoder 3101 shown in FIG. 22.
Figure 24:
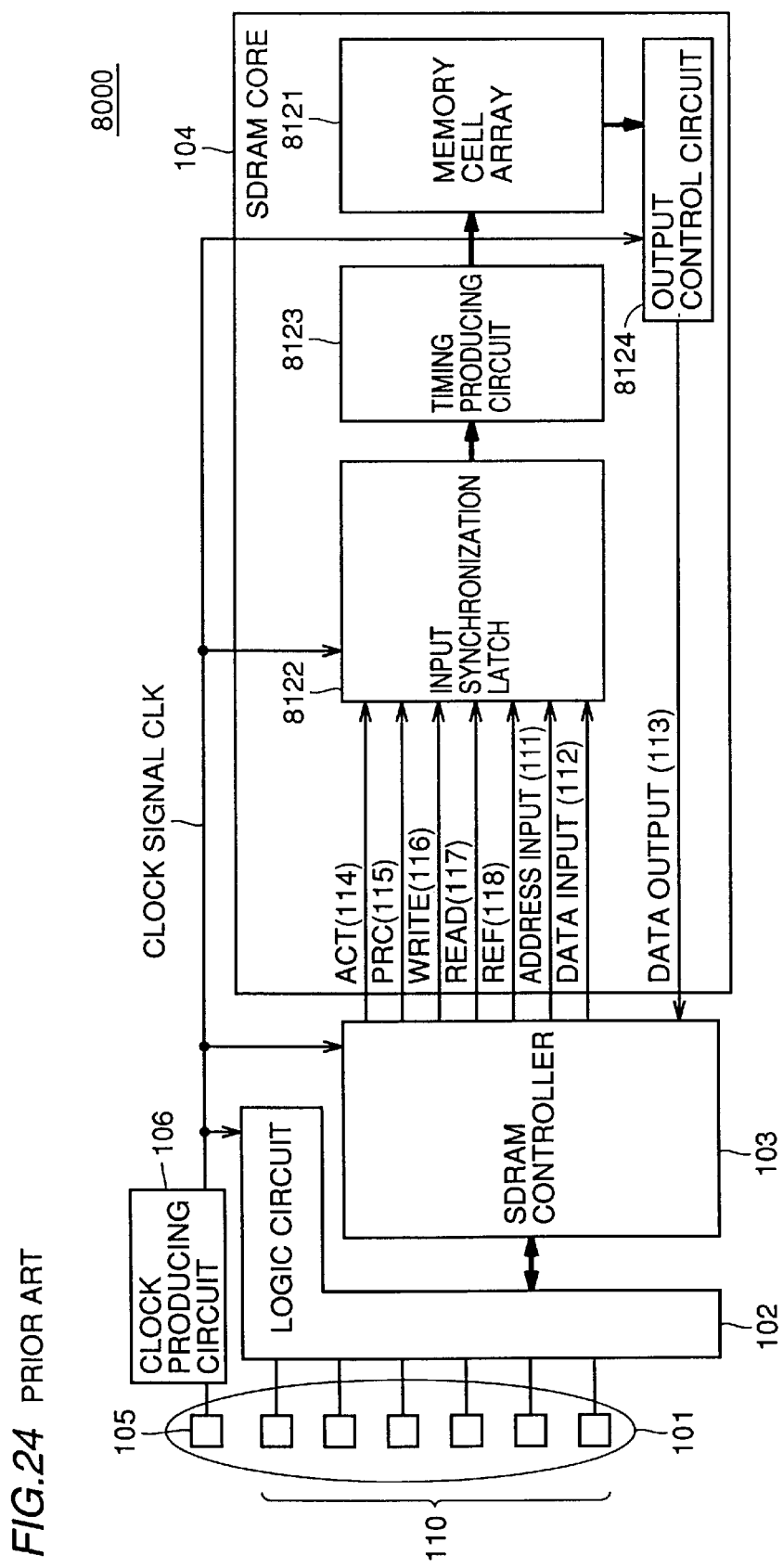
FIG. 24 is a schematic block diagram showing a structure of a semiconductor integrated circuit device 8000 in the prior art.
Figure 25:
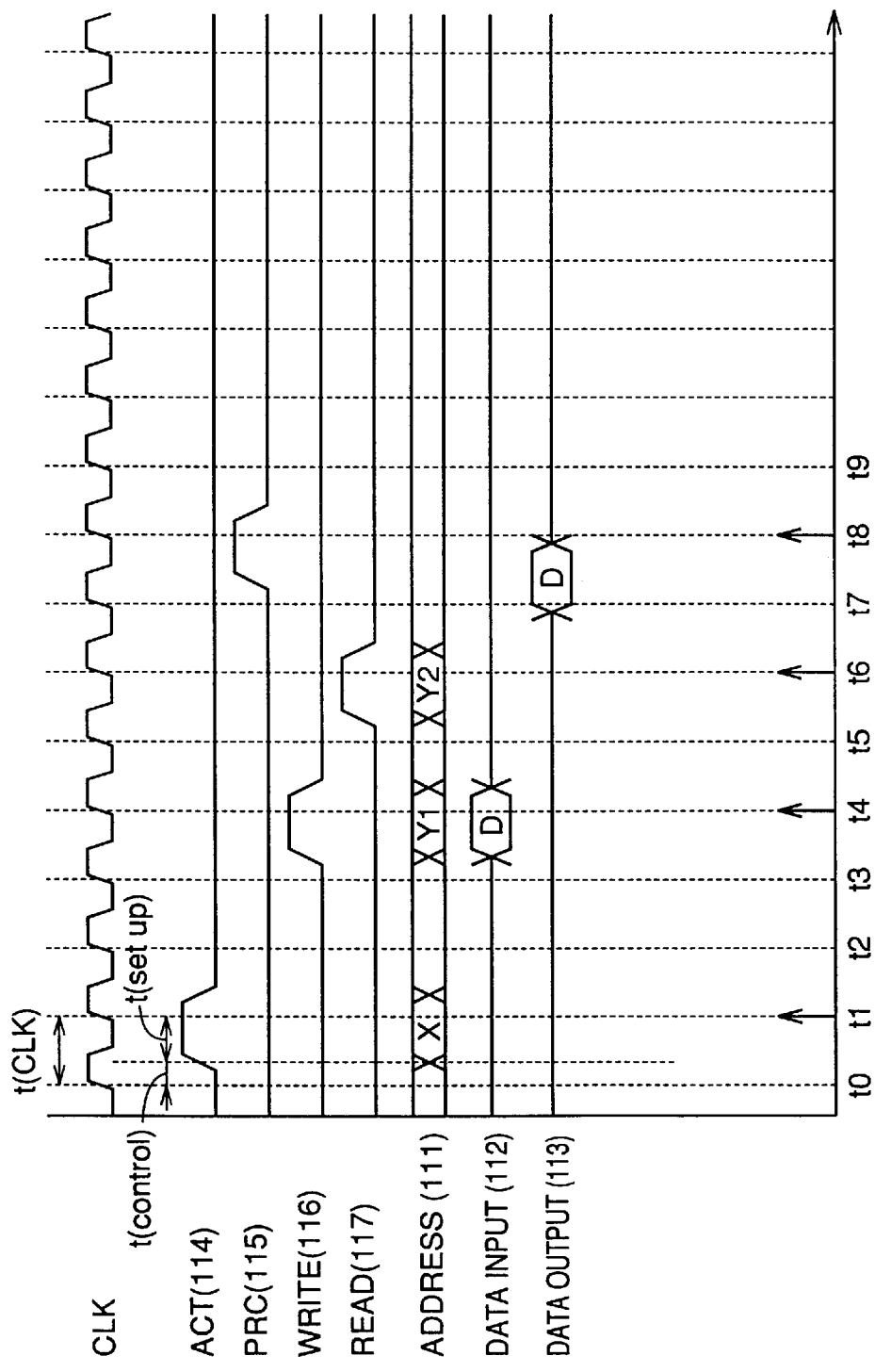
FIG. 25 is a timing chart showing an operation of the semiconductor integrated circuit device 8000 shown in FIG. 24.

FIG. 22 is a schematic block diagram showing structures of the I/O path switch control circuit and input select circuit 827 shown in FIG. 21.

FIG. 22 shows a structure of input select circuit 827, and particularly a portion related to internal control signal ACT. Similar structures are provided for the other internal control signals, respectively.

A switch signal decoder 3101 arranged in I/O path switch control circuit 830 issues select signals SA, SB, SC and SD in accordance with the levels of the command switch signal and test switch signal.

Input select circuit 827 includes a driver circuit 3111 which receives a signal ACT_T sent from test command input terminal group 733 and corresponding to signal ACT, and is activated by signal SA, a driver circuit 3112 which receives a signal ACT_S applied from first command decoder circuit 125, and is activated by signal SA, and a driver circuit 3113 which receives a signal ACT_E applied from second command decoder circuit 126, and is activated by signal SC. One of the signals issued from driver circuits 3111–3113 is applied as internal control signal ACT to input synchronization latch circuit 122.

FIG. 23 shows an operation of switch signal decoder 3101 shown in FIG. 22.

In accordance with the combination of the levels of the command switch signal and test switch signal, signals SA–SD are selectively set to the level achieving the active level.

The structure described above can likewise allow verification of only the operation of DRAM core 104 independently of logic circuit 102 and general-purpose SDRAM controller circuit 103 during the test operation.

Similarly to the second embodiment, the structure shown in FIG. 21 requires no change in design data for DRAM core 104, and allows DRAM core 104 to operate as a clock synchronous EDO-DRAM core.

Description has been given on the two cases, i.e., the case where the operation mode of DRAM core 104 is performed with the general-purpose SDRAM control signals, and the case where it is performed with the general-purpose clock synchronous EDO-DRAM control signals. The invention is not restricted to these cases, and can be applied to various cases by replacing only the command decoder circuit with that for another mode, in which DRAM core 104 can operate. Accordingly, the operation modes are not restricted to two, and design data of DRAM core 104 can be configured to be common to more operation modes.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device comprising:

a logic circuit for effecting an arithmetic operation on externally applied data and producing a control signal corresponding to one of a plurality of operation modes in accordance with externally applied instructions;

a control circuit for receiving said control signal from said logic circuit, and producing one of memory control signal groups respectively corresponding to said plurality of operation modes, each of said memory control signal groups having a plurality of memory control signals;

a memory circuit for transmitting storage data to and from said logic circuit, and storing said storage data, said memory circuit including:

a memory cell array having a plurality of memory cells for storing said storage data, a plurality of control signal input node groups capable of receiving said memory control signal groups, respectively, and a plurality of decoder circuits, respectively provided for said plurality of control signal input node groups, each capable of decoding the memory control signal group applied to a corresponding one of said control signal input node groups and producing an internal control signal for said memory cell array; and a plurality of interconnections for transmitting said memory control signal group sent from said control circuit to one of said plurality of control signal input node groups.

2. The semiconductor integrated circuit device according to claim 1, wherein said memory circuit further includes a select circuit for selecting said internal control signal sent from one of said plurality of decoder circuits in accordance with designation by said externally applied instructions.

3. The semiconductor integrated circuit device according to claim 2, further comprising:

a clock producing circuit for producing an internal clock signal based on an external clock signal, wherein said memory circuit includes:

a latch circuit for holding said internal control signal sent from said select circuit in synchronization with said internal clock signal, and a memory cell array control circuit for producing a memory cell array control signal for controlling an operation of selecting said memory cell in said memory cell array in accordance with the output of said latch circuit.

4. The semiconductor integrated circuit device according to claim 3, wherein said plurality of operation modes includes:

an operation mode as a synchronous dynamic semiconductor memory device, and an operation mode as a clock synchronous EDO-dynamic semiconductor memory device.

5. The semiconductor integrated circuit device according to claim 1, wherein said memory circuit includes:

a plurality of test signal input terminal groups provided corresponding to said plurality of decoder circuits for receiving a test control signal, respectively;

a plurality of switch circuits arranged between said plurality of control signal input node groups and said plurality of decoder circuits for receiving signals sent from said plurality of control signal input node groups and signals sent from said plurality of test signal input terminal groups, and applying the signals sent from either the control signal input node groups or the test signal input terminal groups to said plurality of decoder circuits in response to said externally applied instructions, respectively;

a select circuit for selecting said internal control signal sent from the designated decoder circuit among said plurality of decoder circuits in accordance with said externally applied instructions;

a plurality of test data I/O terminals externally sending and receiving data; and an I/O control circuit for controlling data transmission between said memory cell array and said plurality of test data I/O terminals in a test,operation mode.

6. The semiconductor integrated circuit device according to claim 5, further comprising:

a clock producing circuit for producing an internal clock signal based on an external clock signal, wherein said memory circuit includes:

a latch circuit for holding said internal control signal sent from said select circuit in synchronization with said internal clock signal, and a memory cell array control circuit for producing a memory cell array control signal for controlling an operation of selecting said memory cell in said memory cell array in accordance with the output of said latch circuit.

7. The semiconductor integrated circuit device according to claim 6, wherein said plurality of operation modes includes:

an operation mode as a synchronous dynamic semiconductor memory device, and an operation mode as a clock synchronous EDO-dynamic semiconductor memory device.

8. The semiconductor integrated circuit device according to claim 1, wherein said memory circuit further includes:

a test signal I/O terminal group for receiving a test control signal;

a select circuit for selecting either said internal control signals sent from said plurality of decoder circuits or the signals sent from said test signal input terminal group in accordance with said externally applied instructions;

a plurality of test data I/O terminals externally sending and receiving data; and an I/O control circuit for controlling data transmission between said memory cell array and said plurality of test data I/O terminals in a test operation mode.

9. The semiconductor integrated circuit device according to claim 8, further comprising:

a clock producing circuit for producing an internal clock signal based on an external clock signal, wherein said memory circuit includes:

a latch circuit for holding said internal control signal sent from said select circuit in synchronization with said internal clock signal, and a memory cell array control circuit for producing a memory cell array control signal for controlling an operation of selecting said memory cell in said memory cell array in accordance with the output of said latch circuit.

10. The semiconductor integrated circuit device according to claim 9, wherein said plurality of operation modes includes:

an operation mode as a synchronous dynamic semiconductor memory device, and an operation mode as a clock synchronous EDO-dynamic semiconductor memory device.

* * * * *

UNITED STATES PATENT AND TRADEMARK OFFICE
CERTIFICATE OF CORRECTION

PATENT NO. : 6,411,563 B1
DATED : June 25, 2002
INVENTOR(S) : Takaharu Tsuji et al.

It is certified that error appears in the above-identified patent and that said Letters Patent is hereby corrected as shown below:

<u>Title page,</u>
Item [73], Assignees, change "Matsushita Electric Industrial Col, Ltd.," to
-- Matsushita Electric Industrial Co., Ltd., --

Signed and Sealed this

Twenty-second Day of October, 2002

*Attest:*

*Attesting Officer*

JAMES E. ROGAN
*Director of the United States Patent and Trademark Office*